(12) United States Patent
Higashitani

(10) Patent No.: US 7,655,536 B2
(45) Date of Patent: Feb. 2, 2010

(54) METHODS OF FORMING FLASH DEVICES WITH SHARED WORD LINES

(75) Inventor: Masaaki Higashitani, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 360 days.

(21) Appl. No.: 11/316,474

(22) Filed: Dec. 21, 2005

(65) Prior Publication Data

US 2007/0141780 A1    Jun. 21, 2007

(51) Int. Cl.
  *H01L 21/76* (2006.01)
(52) U.S. Cl. .................. 438/453; 257/211; 257/758; 257/E21.527; 331/181
(58) Field of Classification Search .......... 257/208, 257/211, 315, 390, 391, E27.102; 438/100, 438/584, 585, 587, 586, 589, 590, 592, 400, 438/439, 453; 331/181
See application file for complete search history.

(56) References Cited

U.S. PATENT DOCUMENTS

| 4,185,319 A | 1/1980 | Stewart et al. |
| 4,651,183 A | 3/1987 | Lange et al. |
| 5,043,940 A | 8/1991 | Harari |
| 5,070,032 A | 12/1991 | Yuan et al. |
| 5,095,344 A | 3/1992 | Harari |
| 5,172,338 A | 12/1992 | Mehrotra et al. |
| 5,313,421 A | 5/1994 | Guterman et al. |
| 5,315,541 A | 5/1994 | Harari et al. |
| 5,343,063 A | 8/1994 | Yuan et al. |
| 5,526,307 A | 6/1996 | Yiu et al. |
| 5,570,315 A | 10/1996 | Tanaka et al. |
| 5,661,053 A | 8/1997 | Yuan |
| 5,712,179 A | 1/1998 | Yuan |
| 5,774,397 A | 6/1998 | Endoh et al. |
| 5,867,429 A | 2/1999 | Chen et al. |
| 6,046,935 A | 4/2000 | Takeuchi et al. |
| 6,058,044 A * | 5/2000 | Sugiura et al. ......... 365/185.17 |
| 6,063,688 A | 5/2000 | Doyle et al. |
| 6,222,762 B1 | 4/2001 | Guterman et al. ...... 365/185.03 |
| 6,239,008 B1 | 5/2001 | Yu et al. |
| 6,239,500 B1 | 5/2001 | Sugimachi et al. |
| 6,512,262 B2 | 1/2003 | Watanabe |
| 6,512,263 B1 * | 1/2003 | Yuan et al. .................. 257/316 |

(Continued)

FOREIGN PATENT DOCUMENTS

DE    24 33 803 A1    2/1975

(Continued)

OTHER PUBLICATIONS

PCT/US2006/062188, Invitation to Pay Additional Fees, dated Aug. 27, 2007, 9 pages.

(Continued)

*Primary Examiner*—W. David Coleman
*Assistant Examiner*—Su C Kim
(74) *Attorney, Agent, or Firm*—Vierra Magen Marcus & DeNiro LLP

(57) ABSTRACT

Word lines of a NAND flash memory array are formed by concentric, rectangular shaped, closed loops that have a width of approximately half the minimum feature size of the patterning process used. The resulting circuits have word lines linked together so that peripheral circuits are shared. Separate erase blocks are established by shield plates.

22 Claims, 20 Drawing Sheets

U.S. PATENT DOCUMENTS

| | | | |
|---|---|---|---|
| 6,522,580 | B2 | 2/2003 | Chen et al. |
| 6,583,009 | B1 | 6/2003 | Hui et al. |
| 6,727,195 | B2 | 4/2004 | Templeton et al. |
| 6,750,100 | B2 | 6/2004 | Hsu et al. |
| 6,888,755 | B2 | 5/2005 | Harari |
| 6,893,919 | B2 | 5/2005 | Chuang et al. |
| 6,925,007 | B2 | 8/2005 | Harari et al. |
| 7,015,106 | B2 * | 3/2006 | Yoon et al. .................. 438/283 |
| 7,323,948 | B2 * | 1/2008 | Ding et al. .................. 331/181 |
| 7,397,106 | B2 * | 7/2008 | Tsai et al. .................... 257/529 |
| 7,495,294 | B2 * | 2/2009 | Higashitani .................. 257/390 |
| 2001/0005330 | A1 | 6/2001 | Choi et al. ............. 365/185.17 |
| 2001/0010640 | A1 | 8/2001 | Sato |
| 2002/0008273 | A1 | 1/2002 | Kumazaki |
| 2002/0109194 | A1 | 8/2002 | Ishizuka et al. ............. 257/368 |
| 2003/0157436 | A1 | 8/2003 | Manger et al. |
| 2005/0057998 | A1 * | 3/2005 | Lee et al. .................... 365/222 |
| 2005/0072999 | A1 | 4/2005 | Matamis et al. |
| 2005/0180186 | A1 | 8/2005 | Lutze et al. |
| 2006/0125024 | A1 * | 6/2006 | Ishigaki ...................... 257/390 |
| 2006/0157798 | A1 * | 7/2006 | Hayashi et al. ............. 257/374 |
| 2007/0138535 | A1 | 6/2007 | Higashitani ................. 257/315 |

FOREIGN PATENT DOCUMENTS

| | | |
|---|---|---|
| DE | 2433803 A1 | 2/1975 |

OTHER PUBLICATIONS

EPO/ISA, "PCT Invitation to Pay Additional Fees", mailed in corresponding PCT/US 2006/062188 on Aug. 9, 2007, 9 pages.
Response to Office Action dated Jul. 2, 2008, in U.S. Appl. No. 11/316,654.
International Search Report and Written Opinion, International Application No. PCT/US2006/062188.
Office Action mailed Apr. 3, 2008, U.S. Appl. No. 11/316,654.
Notice of Allowance and Fee(s) Due dated Sep. 4, 2008, in U.S. Appl. No. 11/316,654.
Taiwanese Office Action dated May 21, 2009 in Taiwanese Patent No. 095148283.

* cited by examiner

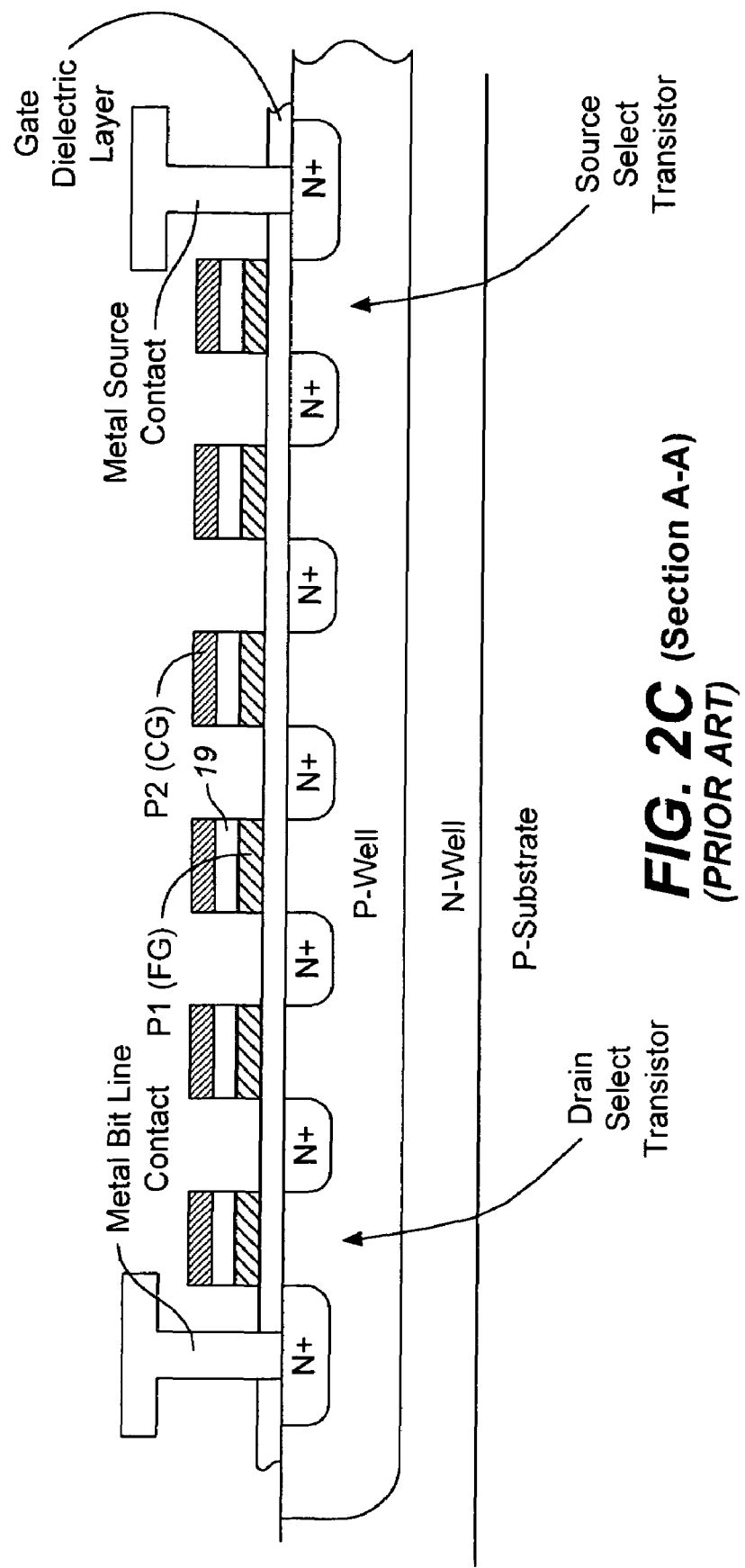
FIG. 2C (Section A-A) (PRIOR ART)

Read    Unit A+1, WLn

| | Unit A | Unit A+1 | Unit A+2 | Unit A+3 |
|---|---|---|---|---|
| SGD | VSS | VSG | VSS | VSS |
| WL31 | VREAD | | Float | |
| WL30 | VREAD | | Float | |
| WL n+1 | VREAD | | Float | |
| WL n | VSS | | Float | |
| WL n−1 | VREAD | | Float | |
| WL1 | VREAD | | Float | |
| WL0 | VREAD | | Float | |
| SGS | VSS | VSG | VSS | VSS |
| Array Source | VSS | | | |
| Pwell | VSS | | | |

FIG. 27A

VSG   4.5v
VREAD  ~4.5v
VSS    0v

Program    Unit A+1, WLn

| | Unit A | Unit A+1 | Unit A+2 | Unit A+3 |
|---|---|---|---|---|
| SGD | VSS | Vdd | VSS | VSS |
| WL31 | VPASS | | Float | |
| WL30 | VPASS | | Float | |
| WL n+1 | VPASS | | Float | |
| WL n | VPGM | | Float | |
| WL n−1 | VPASS | | Float | |
| WL1 | VPASS | | Float | |
| WL0 | VPASS | | Float | |
| SGS | VSS | 0 | VSS | VSS |
| Array Source | ~Vdd | | | |
| Pwell | VSS | | | |

FIG. 27B

VPGM   ~20v
VPASS  ~10v
Vdd    ~2v

Erase    Unit A / Unit A+1

| | Unit A | Unit A+1 | Unit A+2 | Unit A+3 |
|---|---|---|---|---|
| SGD | Float | Float | Float | Float |
| WL31 | VSS | | Float | |
| WL30 | VSS | | Float | |
| WL n+1 | VSS | | Float | |
| WL n | VSS | | Float | |
| WL n−1 | VSS | | Float | |
| WL1 | VSS | | Float | |
| WL0 | VSS | | Float | |
| SGS | Float | Float | Float | Float |
| Array Source | Float | | | |
| Pwell | VERA | | | |

FIG. 27C

VERA   ~20v

Read   Block B+1, WLn

| | Block B | Block B+1 | Block B+2 | Block B+3 |
|---|---|---|---|---|
| SGD | VSS | VSG | VSS | VSS |
| WL31 | VREAD | | Float | |
| WL30 | VREAD | | Float | |
| WL n+1 | VREAD | | Float | |
| WL n | VSS | | Float | |
| WL n−1 | VREAD | | Float | |
| WL1 | VREAD | | Float | |
| WL0 | VREAD | | Float | |
| SGS | VSS | VSG | VSS | VSS |
| Shield Plate | VRSP | VRSP | Float | Float |
| Array Source | VSS | | | |
| Pwell | VSS | | | |

*FIG. 29A*

VSG    ~4.5v
VREAD  ~4.5v
VRSP   ~4.0v
VSS    0v

Program   Block B+1, WLn

| | Block B | Block B+1 | Block B+2 | Block B+3 |
|---|---|---|---|---|
| SGD | VSS | Vdd | VSS | VSS |
| WL31 | VPASS | | Float | |
| WL30 | VPASS | | Float | |
| | | | | |
| WL n+1 | VPASS | | Float | |
| WL n | VPGM | | Float | |
| WL n−1 | VPASS | | Float | |
| | | | | |
| WL1 | VPASS | | Float | |
| WL0 | VPASS | | Float | |
| SGS | VSS | 0 | VSS | VSS |
| Shield Plate | VPSP | VPSP | Float | Float |
| Array Source | ~Vdd | | | |
| Pwell | VSS | | | |

*FIG. 29B*

VPGM   ~20v
VPASS  ~10v
Vdd    ~2v
VPSP   ~10v

Erase   Block B+1

| | Block B | Block B+1 | Block B+2 | Block B+3 |
|---|---|---|---|---|
| SGD | Float | Float | Float | Float |
| WL31 | VSS | | Float | |
| WL30 | VSS | | Float | |
| | | | | |
| WL n+1 | VSS | | Float | |
| WL n | VSS | | Float | |
| WL n−1 | VSS | | Float | |
| | | | | |
| WL1 | VSS | | Float | |
| WL0 | VSS | | Float | |
| SGS | Float | Float | Float | Float |
| Shield Plate | VEISP | VESSP | Float | Float |
| Array Source | Float | | | |
| Pwell | VERA | | | |

*FIG. 29C*

VERA   ~20v
VEISP  ~18v
VESSP  ~5v

METHODS OF FORMING FLASH DEVICES WITH SHARED WORD LINES

CROSS REFERENCE TO RELATED APPLICATION

This application is related to application Ser. No. 11/316,654, entitled Flash Devices With Shared Word Lines to Masaaki Higashitani, filed concurrently and is hereby incorporated by this reference in its entirety.

BACKGROUND

This invention relates to flash memory arrays and in particular to the structures of flash memory arrays and methods of forming them.

All patents, patent applications, publications and other references cited in the present application are hereby incorporated by reference in their entirety.

There are many commercially successful nonvolatile memory products being used today, particularly in the form of small form factor cards, which use an array of flash EEPROM (Electrically Erasable and Programmable Read Only Memory) cells. Such cards may be interfaced with a host, for example, by removably inserting a card into a card slot in a host. Some of the commercially available cards are Compact-FlashTm (CF) cards, MultiMedia cards (MMC), Secure Digital (SD) cards, Smart Media cards, personnel tags (P-Tag) and Memory Stick cards. Hosts include personal computers, notebook computers, personal digital assistants (PDAs), various data communication devices, digital cameras, cellular telephones, portable audio players, automobile sound systems, and similar types of equipment. In an alternative arrangement to the separate card and host described above, in some examples a memory system is permanently connected to a host providing an embedded memory that is dedicated to the host.

An example of a prior art memory system 100 is generally illustrated in the block diagram of FIG. 1. A large number of individually addressable memory cells are arranged in a regular array 110 of rows and columns, although other physical arrangements of cells are certainly possible. Bit lines, designated herein to extend along columns of the array 110, are electrically connected with a bit line decoder and driver circuit 130 through lines 150. Word lines, which are designated in this description to extend along rows of the array 110, are electrically connected through lines 170 to a word line decoder and driver circuit 190. Each of the decoders 130 and 190 receives memory cell addresses over a bus 160 from a memory controller 180. The decoder and driving circuits are also connected to the controller 180 over respective control and status signal lines 135 and 195.

The controller 180 is connectable through lines 140 to a host device (not shown). The host may be a personal computer, notebook computer, digital camera, audio player, various other hand held electronic devices, and the like. The memory system 100 of FIG. 1 will commonly be implemented in a card according to one of several existing physical and electrical standards, such as one from the PCMCIA, the CompactFlash™ Association, the MMC™ Association, and others. When in a card format, the lines 140 terminate in a connector on the card that interfaces with a complementary connector of the host device. The electrical interface of many cards follows the ATA standard, wherein the memory system appears to the host as if it was a magnetic disk drive. Other memory card interface standards also exist. In some systems, a memory card may not have a controller and the functions of the controller may be carried out by the host. As an alternative to the card format, a memory system of the type shown in FIG. 1 may be permanently embedded in the host device.

The decoder and driver circuits 130 and 190 generate appropriate voltages in their respective lines of the array 110, as addressed over the bus 160, according to control signals in respective control and status lines 135 and 195, to execute programming, reading and erasing functions. Any status signals, including voltage levels and other array parameters, are provided by the array 110 to the controller 180 over the same control and status lines 135 and 195. A plurality of sense amplifiers within the circuit 130 receive current or voltage levels that are indicative of the states of addressed memory cells within the array 110, and provides the controller 180 with information about those states over lines 145 during a read operation. A large number of sense amplifiers are usually used in order to be able to read the states of a large number of memory cells in parallel. During reading and program operations, one row of cells is typically addressed at a time through the circuits 190 for accessing a number of cells in the addressed row that are selected by the circuit 130. During an erase operation, all cells in each of many rows are typically addressed together as a block for simultaneous erasure.

Two general memory cell array architectures have found commercial application, NOR and NAND. In a typical NOR array, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells. Examples of such cells, their uses in memory systems and methods of manufacturing them are given in the following U.S. Pat. Nos. 5,070,032; 5,095,344; 5,313,421; 5,315,541; 5,343,063; 5,661,053 and 6,222,762. These patents, along with all other patents, patent applications and other publications referred to in this application are hereby incorporated by reference in their entirety for all purposes.

In a NAND array series strings of more than two memory cells, such as 16 or 32, are connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. An example of a NAND architecture array and its operation as part of a memory system is found in the following U.S. Pat. Nos. 5,570,315; 5,774,397; 6,046,935 and 6,522,580. NAND memory devices have been found to be particularly suitable for mass storage applications such as those using removable memory cards.

FIG. 2A shows a portion of EEPROM cell array 110 of FIG. 1 having a NAND structure. Only a small portion of the repetitive structure is shown. NAND strings of memory cells are formed extending in the Y-direction. NAND strings include implanted source/drain regions that connect individual memory cells. A memory cell includes a floating gate overlying a channel region in the substrate. A series of word lines, WL0-WL3 extend across the memory array in the X-direction and overlie floating gates of memory cells of different strings. In addition, select gate lines (SSL, DSL) extend in the X-direction at either end of the NAND strings and overlie portions of the substrate to form select gates of select transistors that control the connection of NAND strings to memory control circuits. At one end of the NAND strings, a common source line (not shown) connects to each of the NAND strings. At the other end of the NAND strings, connections are made to bit lines (not shown). In a typical NAND memory array, NAND strings that share word lines and select lines form a block in the memory array that is erased as a unit. A typical string may include many memory cells, with 8, 16, 32 or more memory cells in a string being common. Thus, a typical block may have 32 or more word lines extending across the NAND strings of the block. A block may have thousands of strings that are spaced apart in the X-direction. FIG. 2B shows a circuit diagram for the physical structure of FIG. 2A. FIG. 2B includes the common source line connecting the NAND strings at one end. NAND strings are shown extending between bit line connections and common source connections with select transistors controlling these connections.

FIG. 2C shows a cross sectional view of a NAND string of FIG. 2A (indicated by A-A in FIG. 2A). FIG. 2C more clearly shows the structure of individual memory cells having a floating gate (FG) formed from a first polysilicon layer (P1) and a control gate (CG) formed from a second polysilicon layer (P2). The control gate is formed by a portion of a word line that overlies a floating gate. In between a floating gate and a control gate is a dielectric layer 19. In addition, FIG. 2C shows implanted source/drain regions connecting adjacent cells in the NAND string. A gate dielectric layer is shown insulating floating gates from the substrate. Metal bit line contact and source contact are shown at either end of the NAND string. A source select transistor and a drain select transistor are shown having portions of both first polysilicon layer P1 and second polysilicon layer P2. For select transistors, these two layers are connected together so that no floating gate is formed. Alternatively, a single polysilicon layer may be used to form select gates.

The charge storage elements of current flash EEPROM arrays, as discussed in the foregoing referenced patents, are most commonly electrically conductive floating gates, typically formed from conductively doped polysilicon material. An alternate type of memory cell useful in flash EEPROM systems utilizes a non-conductive dielectric material in place of the conductive floating gate to store charge in a non-volatile manner. A triple layer dielectric formed of silicon dioxide, silicon nitride and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region, and erased by injecting hot holes into the nitride. Several specific cell structures and arrays employing dielectric storage elements and are described in U.S. Pat. No. 6,925,007. Thus, while examples given in the present application may refer to floating gates, other charge storage structures may also be used. The present application is not limited to a particular charge storage structure.

As in most integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner, since there is often at least one feature that is limited as to how much it can be shrunk. When this happens, designers will turn to a new or different layout or architecture of the circuit being implemented in order to reduce the amount of silicon area required to perform its functions. The shrinking of the above-described flash EEPROM integrated circuit systems can reach such limits.

One way to form small cells is to use a self-aligned Shallow Trench Isolation (STI) technique. This uses STI structures to isolate adjacent strings of floating gate cells such as those of NAND type memory arrays. According to this technique, a gate dielectric (tunnel dielectric) layer and floating gate polysilicon layer are formed first. Next, STI structures are formed by etching the gate dielectric and floating gate polysilicon layers and the underlying substrate to form trenches. These trenches are then filled with a suitable material (such as oxide) to form STI structures. The portions of the gate dielectric and floating gate polysilicon layers between STI structures are defined by the STI structures and are therefore considered to be self-aligned to the STI structures. Typically, the STI structures have a width that is equal to the minimum feature size that can be produced with the processing technology used. STI structures are also generally spaced apart by the minimum feature size. Thus, the portions of the gate dielectric and floating gate polysilicon layers between STI regions may also have a width that is equal to the minimum feature size. The strips of floating gate polysilicon are further formed into individual floating gates in later steps.

Another way to form small cells is to reduce the size of the features. However, lithographic processes used to establish the dimensions of devices are generally limited by some minimum feature size. Memory cells are generally designed to have dimensions that are equal to this minimum feature size (F). Thus, in FIG. 2A, the width of NAND strings and the separation between adjacent NAND strings is approximately F. Also, the width of the word lines and separation between adjacent word lines is approximately F. In one technique, sidewall spacers are grown that are narrower than F and used to form word lines that are narrower than F. An example of such a technique is described in U.S. Pat. No. 6,888,755.

While memory cells within a memory array may be scaled down in size using various techniques (including providing features that are smaller than the minimum feature size), peripheral circuits may not always be so easily scaled. Peripheral circuits include various circuits that are on the same substrate as a memory array and are used to manage the memory array. Examples of peripheral devices include word line decoder and driver circuits and bit line decoder and driver circuits. Peripheral circuits may have to withstand relatively large voltages so that they require relatively thick dielectric layers and relatively large device sizes. Because such peripheral circuits are not generally scaled down in size in proportion to the memory array, these peripheral circuits come to occupy an undesirably large area on a substrate.

SUMMARY

A memory array is formed using sidewall spacers to pattern a masking layer, sidewall spacers having a width that is approximately half the minimum feature size of the lithographic process used. The masking layer pattern is then used to form word lines that overlie and are self aligned to floating gates. Sidewalls are formed as rectangular shaped, closed loops, and so word lines are also formed as portions of rectangular shaped, closed loops that connect word lines of adjacent blocks (or in some cases, two word lines of the same block). Two word lines connected in this manner share word line decoder and driver circuits. The number of decoder and driver circuits may be reduced by half as a result of sharing by two word lines, thus providing a significant space saving.

A process using sidewalls to form narrow word lines also forms select lines using sidewalls to define the extent of select lines so that select lines are not separately aligned to the memory array but are defined by the same process steps that define word lines. Photoresist portions are used in formation of select lines, but the locations of edges of select lines are not determined by photoresist. Instead, locations of edges are determined by sidewalls of the same masking layer whose sidewalls establish word line locations. While photoresist portions are aligned to the masking layer that defines word lines, the alignment is not critical and a certain amount of misalignment may be tolerated because it does not affect the locations of features formed.

Forming contacts to narrow word lines (having a thickness less than the minimum feature size) may be difficult. Contact pads may be provided that have larger dimensions than the word line. Contact pads are formed by the same steps used to form select lines. Thus, the locations of contact pads are determined by sidewalls of the same masking layer used to establish locations of word lines and select lines. Subsequently, photoresist portions are added in a step that is tolerant of misalignment.

In some examples, all NAND strings that have word lines connected together are erased together and thus form a single block. This results in a block that is similar to two conventional block-like units connected together by word lines. Alternatively, a more conventional block arrangement is achieved by providing shield plates for each block, thus making the blocks separately erasable. Shield plates allow different voltages to be coupled to floating gates of different blocks, even though the word lines of the different blocks are connected together and therefore have the same voltage. Thus, a sufficient voltage difference between floating gates and the substrate can be established for one block to allow erasing, while an adjacent block that shares the same word lines has a lower voltage difference between floating gates and the substrate and therefore does not undergo erasing.

BRIEF DESCRIPTION OF THE DRAWINGS

FIG. 2C shows a cross section of a prior art NAND string of FIG. 2A.

FIG. 13 shows the same stage of fabrication as FIG. 5 from a different perspective.

FIG. 14 shows the same stage of fabrication as FIG. 6 from a different perspective.

FIG. 15 shows the same stage of fabrication as FIG. 8 from a different perspective.

FIG. 16 shows the same stage of fabrication as FIG. 11, with additional source and drain contacts.

FIG. 27A shows voltage values applied to elements of the NAND array of FIG. 26 during a read operation.

FIG. 27B shows voltage values applied to elements of the NAND array of FIG. 26 during a program operation.

FIG. 27C shows voltage values applied to elements of the NAND array of FIG. 26 during an erase operation.

FIG. 29A shows voltage values applied to elements of the NAND array of FIG. 28 during a read operation.

FIG. 29B shows voltage values applied to elements of the NAND array of FIG. 28 during a program operation.

FIG. 29C shows voltage values applied to elements of the NAND array of FIG. 28 during an erase operation.

DETAILED DESCRIPTION OF EXEMPLARY EMBODIMENTS

Figure 1:
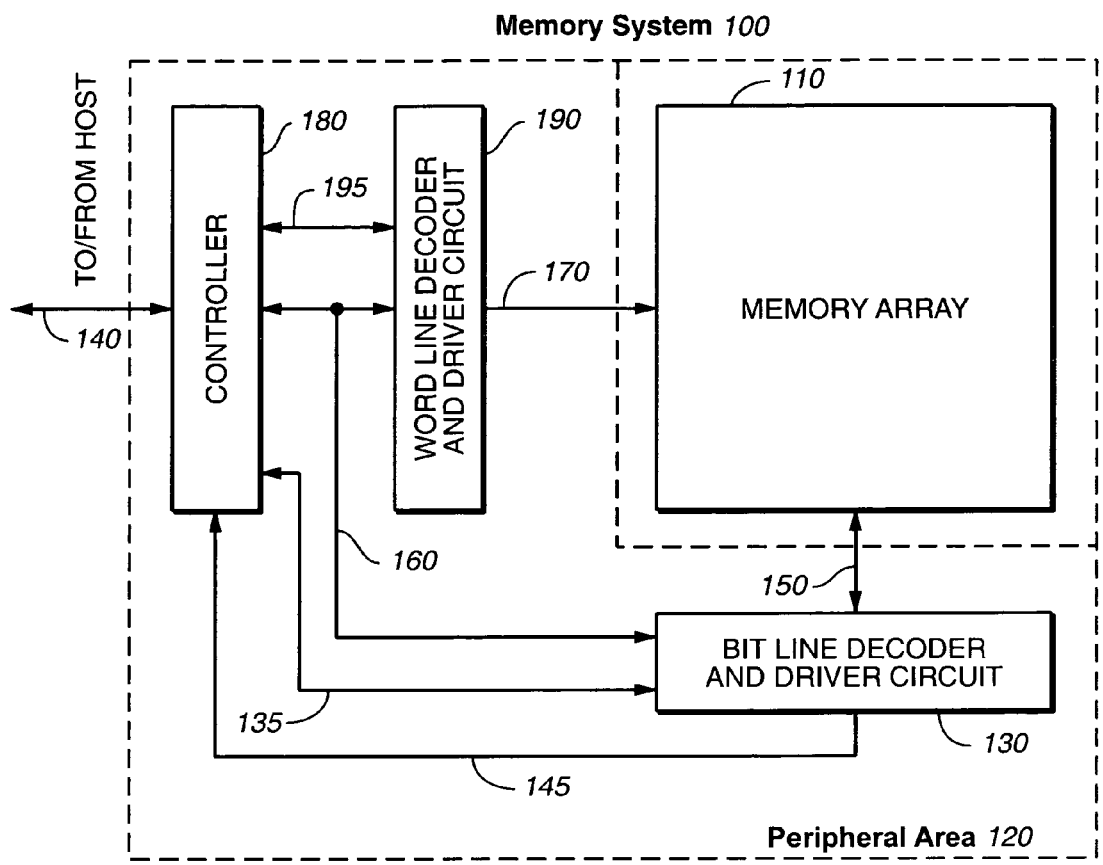
FIG. 1 shows a memory system of the prior art.
Figure 2A:
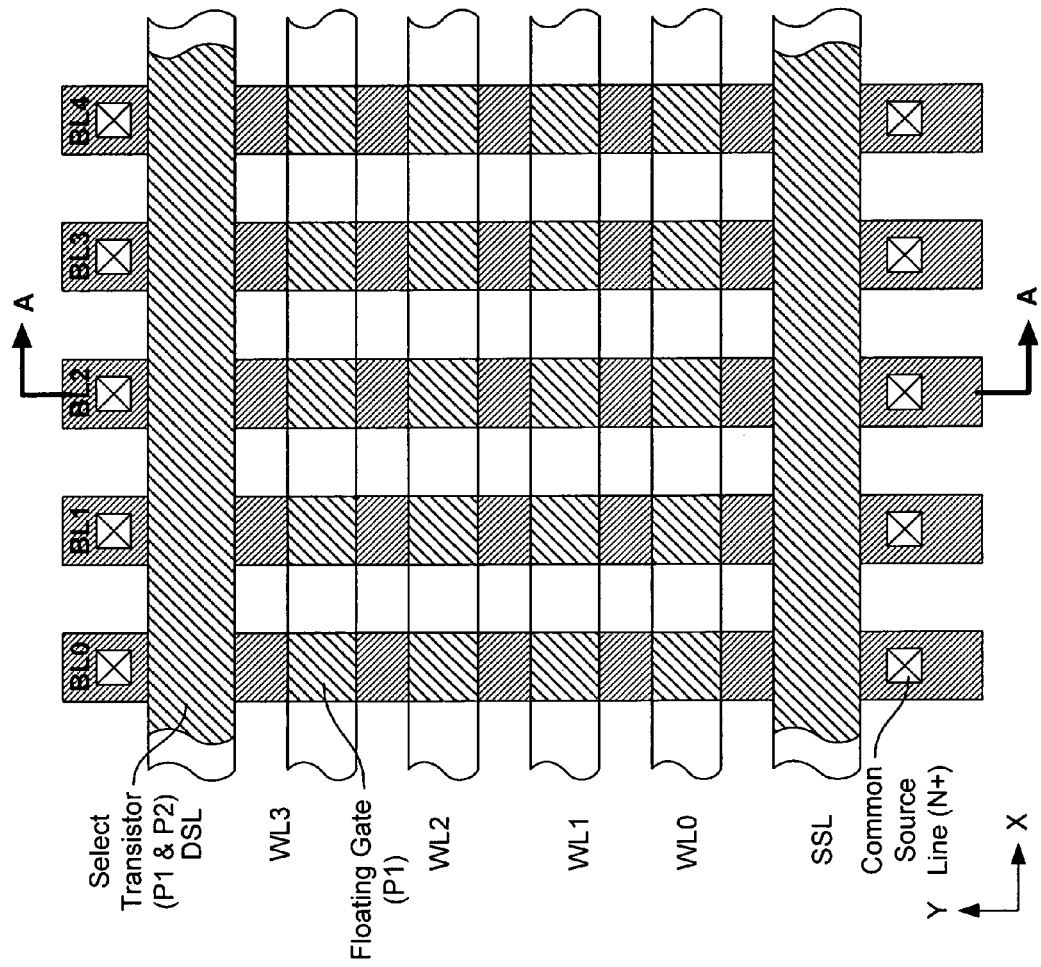
FIG. 2A shows a NAND flash memory array of the prior art.
Figure 2B:
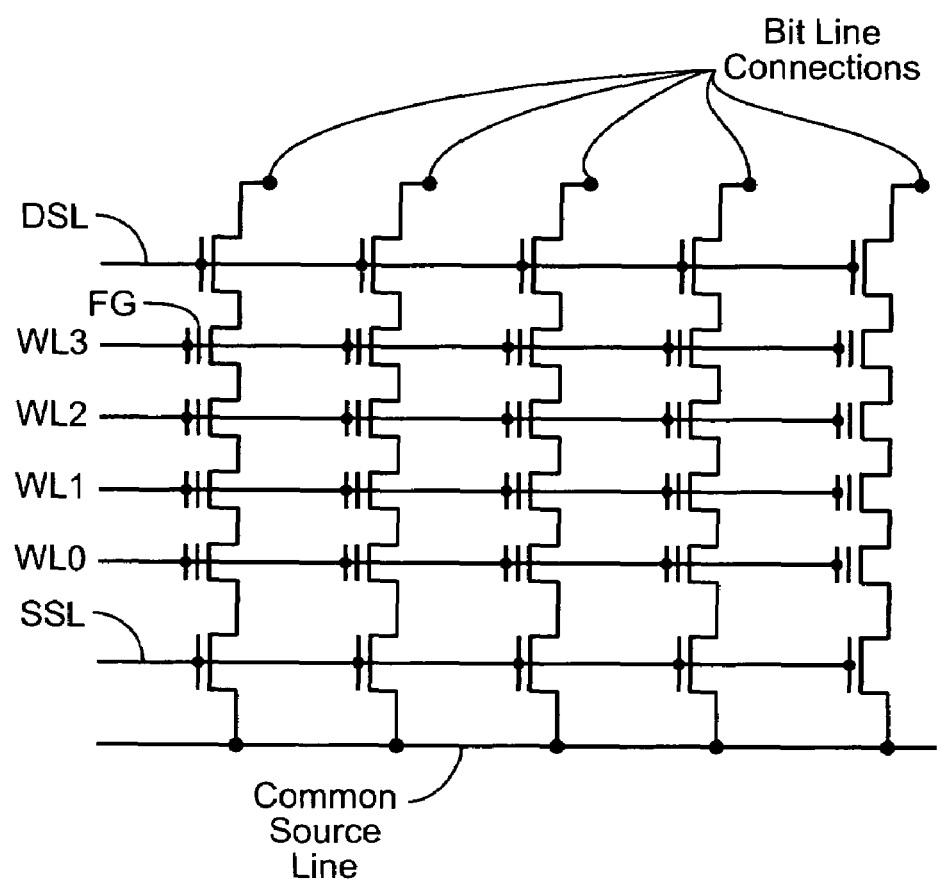
FIG. 2B shows a circuit diagram for the prior art NAND flash memory array of FIG. 2A.
Figure 3:
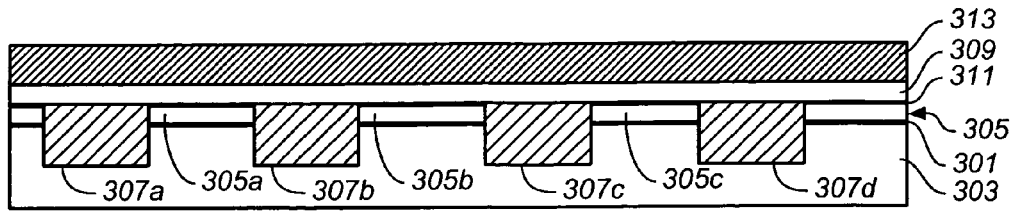
FIG. 3 shows a cross section of a NAND flash memory array according to an embodiment of the present invention at an intermediate stage of fabrication.

FIG. 3 shows a cross section of a NAND array according to an embodiment of the present invention at an intermediate stage of fabrication. The formation of the NAND array up to this point may follow a conventional technique where a first dielectric layer 301 (gate oxide layer) is formed over a substrate 303 and subsequently a first polysilicon layer 305 is formed over first dielectric layer 301. First polysilicon layer 305 is doped so that it is electrically conductive. STI structures 307a-d are formed by patterning substrate 303 and etching trenches through first polysilicon layer 305 and through first dielectric layer 301. The trenches also extend into substrate 303. The trenches are filled with STI material (a suitable dielectric material such as Silicon dioxide) to provide electrical insulation between devices. Thus, strips of STI material form STI structures 307a-d that extend across substrate 303 (in a direction perpendicular to the cross section of FIG. 3) separated by strips 305a-c of first polysilicon layer 305. Both STI structures 307a-d and strips 305a-c of first polysilicon have a width that is the minimum feature size (F) of the process used for patterning. Subsequently, a second polysilicon layer 309 is deposited that overlies both STI structures 307a-d and strips 305a-c of first polysilicon material. Second polysilicon layer 309 is also doped and electrically conductive. Second polysilicon layer 309 is separated from strips 305a-c of first polysilicon by a second dielectric layer 311. Subsequently, a masking layer 313 is formed over second polysilicon layer 309. In this case, masking layer 313 is formed of a dielectric, Silicon Nitride (SiN), though other suitable masking materials may also be used.

Figure 4:
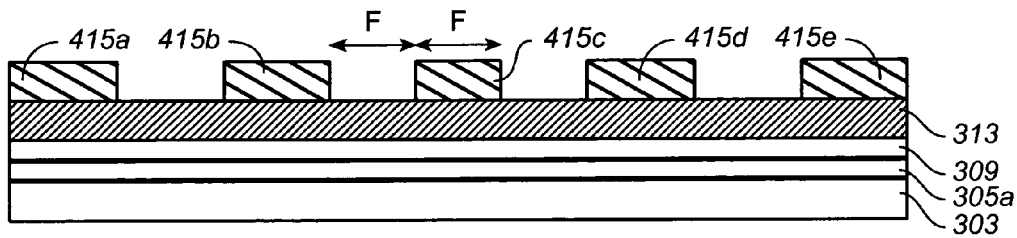
FIG. 4 shows a cross section of the NAND flash memory array of FIG. 3 along a direction perpendicular to the cross section of FIG. 3 with photoresist portions visible.

FIG. 4 shows a cross section of the NAND array of FIG. 3 along a direction that is at right angles to the cross section of FIG. 3. Thus, FIG. 4 shows a single strip 305a of first polysilicon material in cross section with second polysilicon layer 309 overlying strip 305a. FIG. 4 also shows portions 415a-e of photoresist overlying masking layer 313. Portions of photoresist 415a-e are formed by applying a blanket layer of photoresist and then patterning the photoresist using a lithographic process. Portions of photoresist 415a-e may be formed as strips having a width that is equal to the minimum feature size (F) of the lithographic process used. Portions of photoresist 415a-e may also be spaced apart by a distance that is equal to F. Other dimensions greater than F may also be used. While the present process uses photoresist that is patterned by being exposed to light, other patterning processes may also be used including e-beam lithography.

Figure 5:
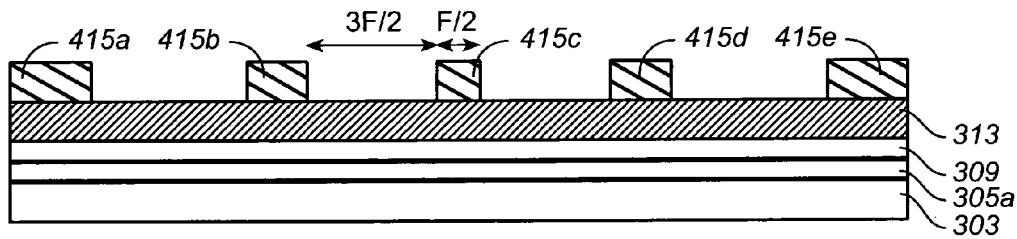
FIG. 5 shows the structure of FIG. 4 in the same view after photoresist slimming to reduce the width of photoresist portions.

FIG. 5 shows the NAND array of FIG. 4, along the same cross section, after a resist slimming step is performed. Resist slimming involves subjecting portions of photoresist 415a-c to etching to remove at least some photoresist and so make portions of photoresist 415a-e narrower. A conventional etch may be used for this step, such as a dry etch. In the example shown, portions of photoresist 415a-e are narrowed from an initial width equal to the minimum feature size (F) to about half the initial width (F/2). The distance between portions of photoresist 415a-e increases accordingly from an initial distance (F) to one and a half times the initial distance (3F/2).

Figure 6:
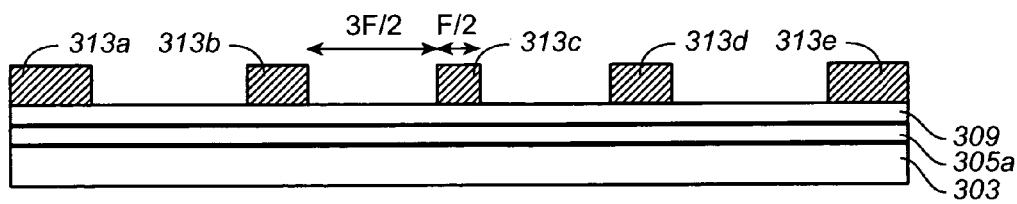
FIG. 6 shows the structure of FIG. 5 after slimmed photoresist portions are used as an etch mask to pattern an underlying Silicon Nitride layer.

Subsequent to resist slimming, the slimmed portions of photoresist are used to pattern the underlying Silicon Nitride masking layer 313. An etch is performed so that unexposed portions of masking layer 313 are removed, while those portions of masking layer 313 that are covered by portions of photoresist 415a-e are not removed. Portions of photoresist 415a-e are then removed. FIG. 6 shows the resulting structure along the same cross section as FIG. 5. The etch stops when second polysilicon layer 309 is reached so that second polysilicon layer 309 is not affected by this step. This patterning step transfers the pattern of the portions of photoresist 415a-e to masking layer 313 so that masking portions 313a-e are formed having a width of F/2 that are separated by 3F/2.

Figure 7:
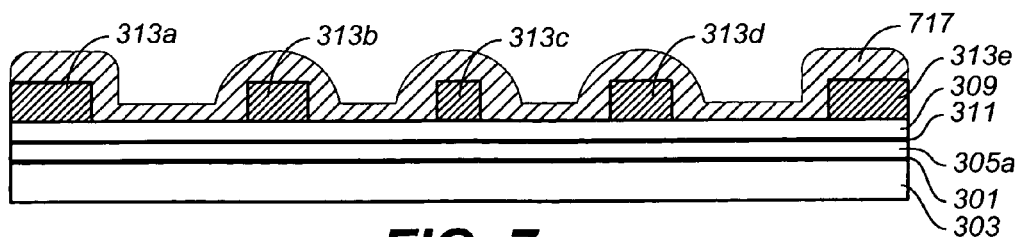
FIG. 7 shows the structure of FIG. 6 after deposition of a Silicon dioxide layer that overlies Silicon Nitride portions and exposed polysilicon.

FIG. 7 shows the structure of FIG. 6, along the same cross section, after formation of a third dielectric layer 717 that overlies masking portions 313a-e and the exposed areas of the second polysilicon layer. In this example third dielectric layer 717 is formed of Silicon dioxide (SiO2 or "oxide"). Third dielectric layer 717 is formed as a blanket layer by a conventional process such as Chemical Vapor Deposition (CVD). Third dielectric layer 717 is generally a thicker dielectric layer than first dielectric layer 301 and second dielectric layer 311. Third dielectric layer. 717 extends along second polysilicon layer 309 where it is exposed and extends along the top surfaces and sidewalls of masking portions 313a-e.

Figure 8:
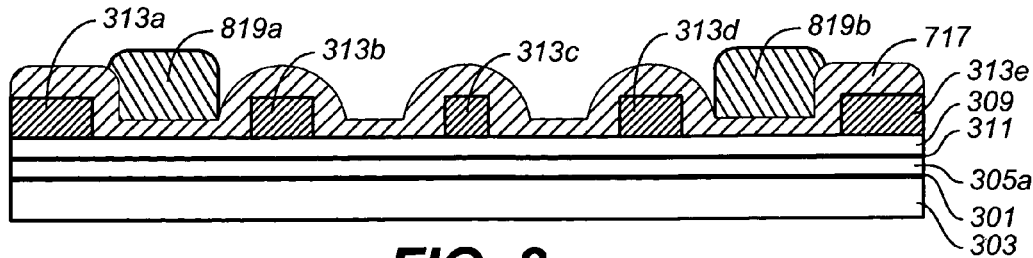
FIG. 8 shows the structure of FIG. 7 after deposition of photoresist portions to cover areas of the Silicon dioxide layer.

FIG. 8 shows the structure of FIG. 7, along the same cross section, after formation of photoresist portions 819a, 819b overlying portions of third dielectric layer 717. Photoresist portions 819a, 819b may be formed by covering the structure with photoresist, then patterning the photoresist using a lithographic process by removing unwanted portions of photoresist. Photoresist portions 819a, 819b extend over portions of third dielectric layer 717 that directly overlie second polysilicon layer 309. Subsequent to formation of photoresist portions 819a, 819b, an etch is carried out to remove certain exposed portions of third dielectric layer 717.

Figure 9:
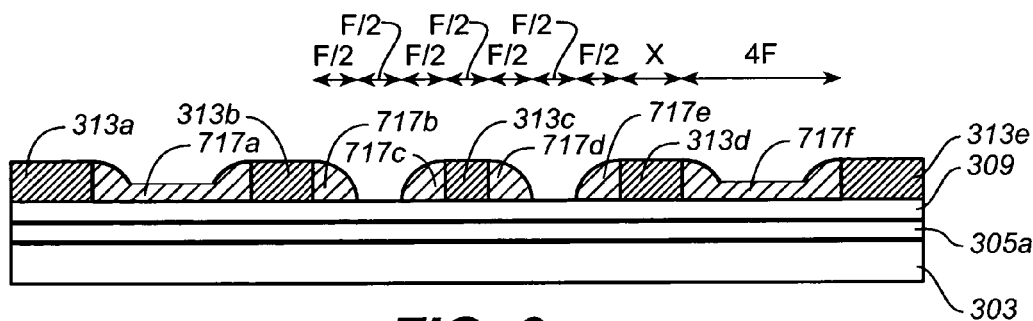
FIG. 9 shows the structure of FIG. 8 after etching of the Silicon dioxide layer to remove portions that are not adjacent to sidewalls of Silicon Nitride portions or covered by photoresist and subsequent removal of photoresist portions.

FIG. 9 shows the structure of FIG. 8, along the same cross section, after an etch step is carried out. The etch step may use anisotropic etching such as Reactive Ion Etching (RIE) so that third dielectric layer 717 is etched through in some places but portions 717a-f of third dielectric layer 717 remain along sidewalls of masking portions 313a-e because of the vertical thickness of third dielectric layer 717 in these locations. Remaining portions 717a-f of third dielectric layer 717 include portions 717b-e referred to as sidewall spacers because they are formed along sidewalls of masking portions 313b-d. The dimensions of sidewall spacers 717b-e are determined by the thickness of third dielectric layer 717 and by the nature of the anisotropic etch used. In this case, sidewall spacers 717b-e have a width of approximately half the minimum feature size (F/2), leaving gaps between sidewall spacers 717b-e that are also approximately half the minimum feature size. After the etch is completed, a photoresist strip step is also performed to remove photoresist portions 819a, 819b. This leaves wide dielectric portion 717a that extends between masking portions 313a and 313b and wide dielectric portion 717f that extends between masking portions 313d and 313e. The dimensions of wide dielectric portions 717a, 717f are determined by the locations of masking portions 313a, 313b, 313d and 313e, not by the dimensions of photoresist portions 819a, 819b. Thus, wide dielectric portions 717a, 717f, which subsequently establish the locations of select gate lines, are aligned with sidewall spacers 717b-e, which subsequently establish the locations of word lines, and do not require separate alignment, unlike many prior art schemes. The precise positioning of photoresist portions 819a, 819b is not critical to positioning of wide dielectric portions 717a, 717f. Photoresist portions 819a, 819b should extend from close to one sidewall to close to an adjacent sidewall but precise alignment is not required. Edges of photoresist portions 819a, 819b do not have to coincide with locations of sidewalls because the thicker dielectric layer in these areas ensures that the dielectric will not be etched through. In the present example, wide dielectric portions 717a, 717f have a width of approximately four times the minimum feature size (4F). FIG. 9 shows a masking portion 313d having a width of X. In the present example, X is approximately F/2, though in other examples X may be greater than F/2. The distance X later establishes a distance between a floating gate and a select gate, so this distance may be chosen separately and is not necessarily the same as the distance between floating gates.

Figure 10:
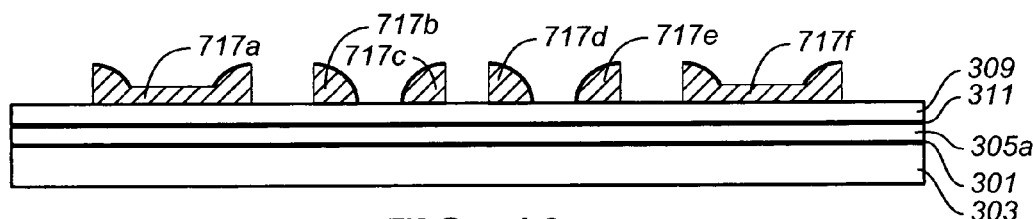
FIG. 10 shows the structure of FIG. 9 after removal of Silicon Nitride portions leaving Silicon dioxide portions on polysilicon.

FIG. 10 shows the structure of FIG. 9, along the same cross section, after removal of masking portions 313a-e. Sidewall spacers 717b-e and wide dielectric portions 717a, 717f remain in place overlying the second polysilicon layer 309. Subsequently, sidewall spacers 717b-e and wide dielectric portions 717a, 717f are used as an etch mask to pattern underlying layers to form the memory array.

Figure 11:
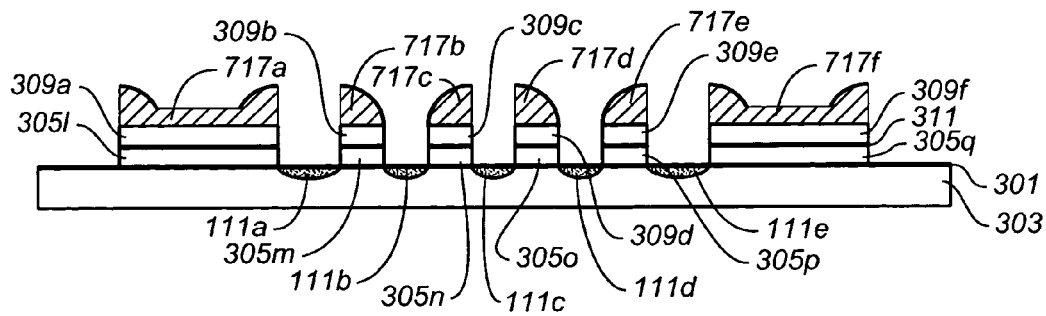
FIG. 11 shows the structure of FIG. 10 after using Silicon dioxide portions as an etch mask to pattern underlying polysilicon layers to form floating gates, select gates and word lines.

FIG. 11 shows the structure of FIG. 10 along the same cross section after an etch step is carried out to etch through polysilicon strip 305a, second polysilicon layer 309 and second dielectric layer 311, stopping on first dielectric layer 301 or on substrate 303. This etch step separates second polysilicon layer 309 into separate word lines 309b-e and strips 309a, 309f. This etch also separates the strips of the first polysilicon layer into separate floating gates 305m-p. Word lines 309b-e form control gates where they overlie floating gates 305m-p. Because word lines 309b-e and floating gates 305m-p are formed by the same etch step they are self aligned. Portions 305l and 305q are also formed under strips 309a, 309f. Portion 305l is electrically connected to strip 309a to form a first select gate. Similarly, portion 305q is electrically connected to strip 309f to form a second select gate. Such self aligned structures as those shown in FIG. 11 provide uniform coupling between floating gates and control gates and simplify fabrication. After the etch step is completed, source/drain regions 11a-e may be formed by implanting dopants into exposed areas of substrate 303. These exposed areas lie between floating gates 308m-p so that the source/drain regions connect memory cells of a string. After source/drain regions 11a-e are formed, the memory array may be covered by a protective layer such as a thick dielectric layer or other protective material. Sidewall spacers 717b-e and wide dielectric portions 717a, 717f may be removed prior to forming the protective layer or may remain in place when the protective layer is formed.

Figure 12:
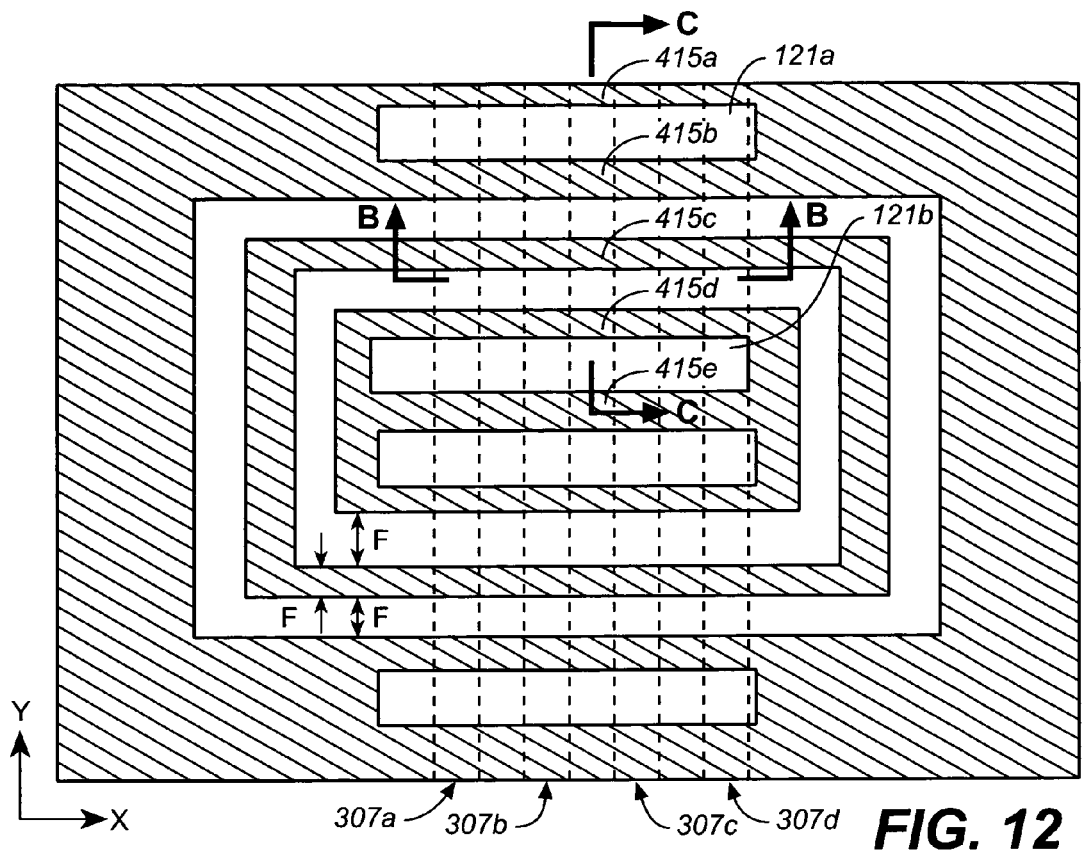
FIG. 12 shows the structure of FIGS. 3 and 4 from above with markings B-B and C-C to show the views of FIGS. 3 and 4 respectively.
Figure 14:
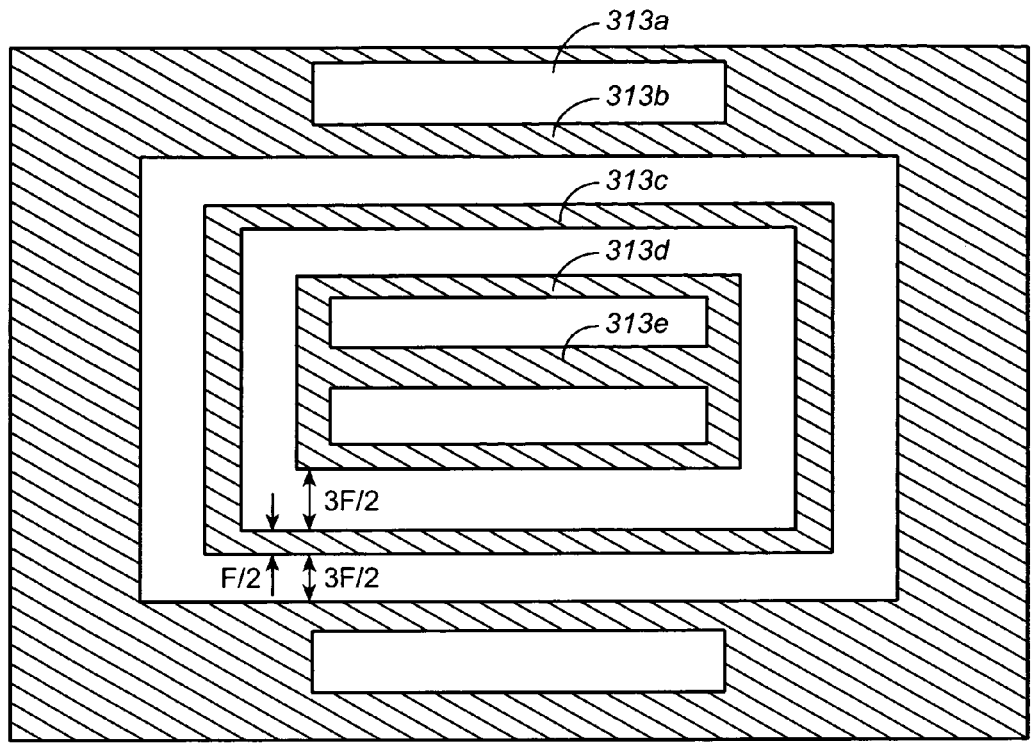
FIG. 14 shows the structure of FIG. 13 after patterning of underlying Silicon Nitride using slimmed photoresist portions as an etch mask.

FIG. 12 shows the NAND array of FIGS. 3-11 in plan view. The cross sections of FIGS. 3 and 4-11 are indicated in FIG. 12 by B-B and C-C respectively. FIG. 12 shows the NAND array at a stage of formation that corresponds to that shown in FIGS. 3 and 4. Photoresist portion 415c is shown extending across the memory array in the X-direction and also in the Y direction to form a closed loop. In some memory arrays, several similar concentric loops may be used. The width of photoresist portion 415c forming the closed loop is F, the minimum feature size of the lithographic process used to form photoresist portion 415c. Between photoresist portions 415b-d are openings that also have a width of F. An opening 121a is formed between photoresist portions 415a and 415b that is wider than F. A similar opening 121b is formed between photoresist portions 415d and 415e. It can be seen that photoresist portion 415e of FIG. 4 is not just a strip extending in the X-direction, but is a strip that extends in both X and Y directions to form a closed, rectangular shaped loop. It can also be seen that the structure of cross section C-C is formed with a mirror-image structure also formed using the same photoresist pattern. FIG. 14 includes dotted lines that show the locations of STI structures 307a-d that underlie photoresist portions 415a-e, masking layer 313 and second polysilicon layer 309. STI regions 307a-d, along with first and second polysilicon layers 305, 309 are formed prior to forming photoresist portions 415a-e.

Figure 13:
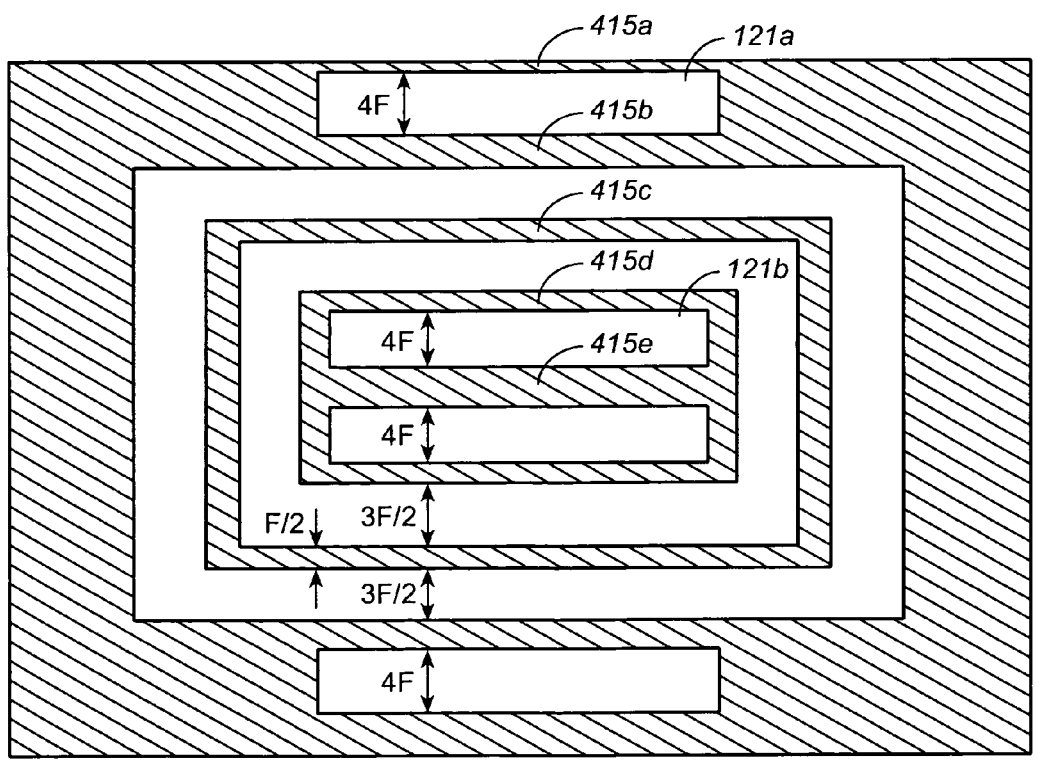
FIG. 13 shows the structure of FIG. 12 after photoresist slimming is performed to reduce the width of photoresist portions.

FIG. 13 shows the structure of FIG. 12, in the same plan view, after resist slimming. Thus, the structure of FIG. 13 corresponds to the cross section shown in FIG. 5. As can be seen, photoresist portions 415a-e have become narrower and openings between photoresist portions 415a-e have become correspondingly wider as a result of photoresist slimming. In this example, photoresist portions 415b-d are narrowed to a width of approximately F/2 while the openings between photoresist portions 415b-d are increased to a width of approximately 3F/2. Opening 121a between photoresist portions 415a and 415b has a width of approximately 4F. Opening 121b between photoresist portions 415d and 415e also has a width of 4F.

FIG. 14 shows the structure of FIG. 13 after the photoresist pattern of FIG. 13 is transferred to masking layer 313 as a result of an etching step using photoresist portions 415a-e as an etch mask. Thus, the structure of FIG. 14 corresponds to the cross section shown in FIG. 6. Third dielectric layer 717 (not shown) is formed over masking portions 313a-e. Third dielectric layer 717 overlies both masking portions 313a-e and exposed areas of underlying second polysilicon layer 309 in openings between masking portions 313a-e.

Figure 15:
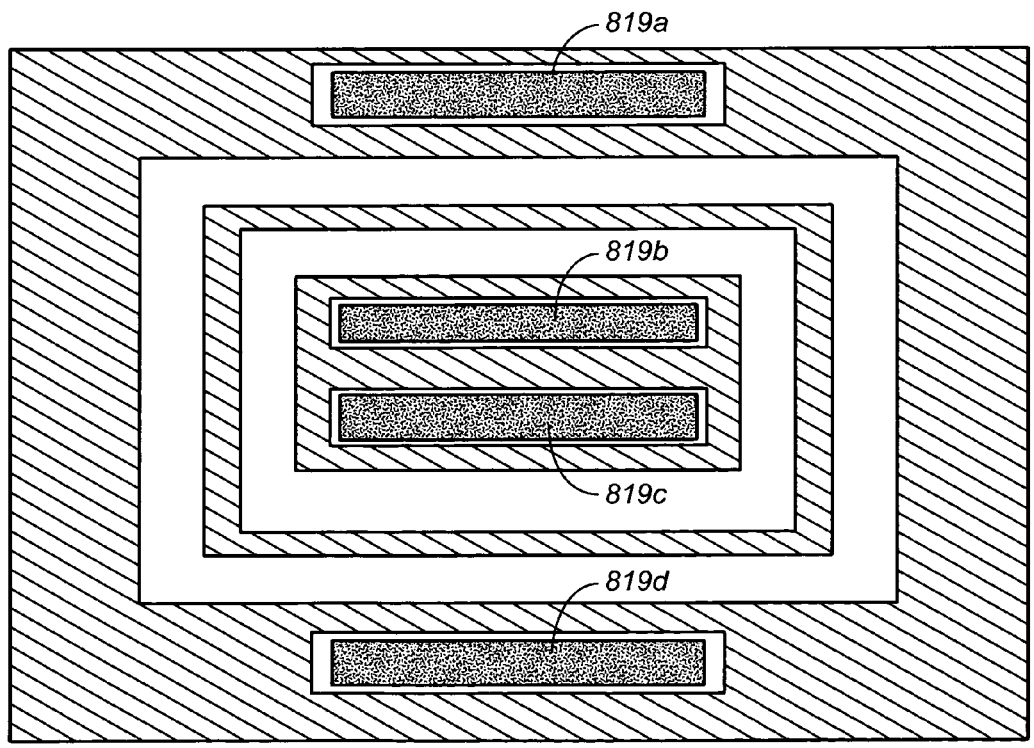
FIG. 15 shows the structure of FIG. 14 after deposition of a Silicon dioxide layer and formation of photoresist portions to cover parts of the Silicon dioxide layer.

FIG. 15 shows the structure of FIG. 14 after formation of photoresist portions 819a-d overlying third dielectric layer 717. Thus, the structure of FIG. 15 corresponds to the cross section shown in FIG. 8. As is shown, photoresist portions 819a-d are somewhat smaller than the openings between masking portions. Photoresist portions 819a-d do not have to be exactly aligned with openings between masking portions. Subsequent to forming photoresist portions 819a-d, an etch is carried out to remove portions of third dielectric layer 717, leaving sidewall spacers 717b-e and portions third dielectric layer 717 covered by photoresist portions 819a-d. Then, photoresist portions 819a, 819b are removed and masking portions 313a-e are removed. Subsequently, an etch is performed to etch the underlying first polysilicon layer 305 and second polysilicon layer 309 in the pattern of the remaining portions of third dielectric layer 717.

Figure 16:
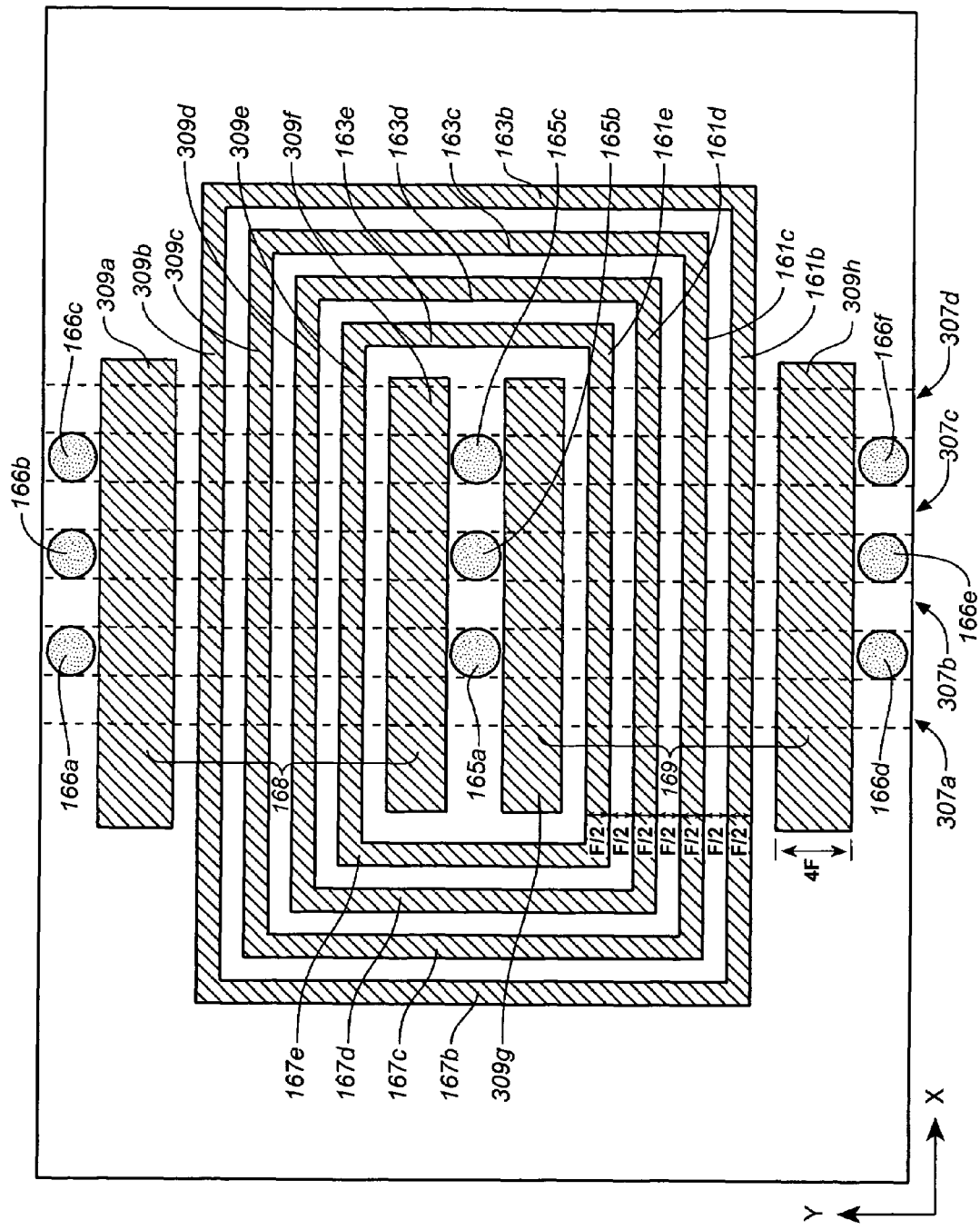
FIG. 16 shows the structure of FIG. 15 after etching of the Silicon dioxide layer, removal of photoresist portions, removal of Silicon Nitride portions and etching of underlying polysilicon layers using Silicon dioxide portions as an etch mask.

FIG. 16 shows the resulting structure after etching first polysilicon layer 305 and second polysilicon layer 309. A series of concentric, rectangular shaped, closed loops are formed in the pattern of sidewall spacers 717b-e. Word lines 309b-e form portions of these loops. Word lines 309b-e have a width of F/2 and are spaced approximately F/2 apart. Underlying word lines 309b-e are STI structures 307a-d and, between STI structures 307a-d, floating gates formed from the first polysilicon layer 305. Because word lines 309b-e and floating gates are formed by the same etch step they are self aligned. Word lines 309b-e form control gates where they overlie floating gates. Word lines are connected together in pairs in the structure shown, with connections formed at either end of word lines by portions of loops that extend in the Y-direction. Thus, for example, word lines 309b and 161b are connected by portions 163b and 167b. Similarly, word lines 309c-e are connected with word lines 161c-e by portions 163c-e and portions 167c-e. The connecting portions 163b-e, 167b-e at word line ends may be formed of portions of both first polysilicon layer 305 and second polysilicon layer 309 joined together in a similar way to select lines. Also shown in FIG. 16 are select lines 309a, 309f-h. Select lines 309a, 309f-h have a width that is approximately 4F. A NAND string is formed by a series of floating gate memory cells connected between two select lines. Thus, FIG. 16 shows two units 168, 169 of NAND strings that have their word lines connected together but have separate select lines. Source and drain contacts are also shown in FIG. 16. In the present example, source contacts 165a-c are connected together to form a common source contact for all the NAND strings shown. Drain contacts 166a-f are connected to bit lines that run in the Y direction above the word lines.

While the structure of FIG. 16 shows portions 163b-e, 167b-e that extend in the Y-direction to connect word lines 309b-e and word lines 161b-e together, the space occupied by such portions is generally not significant. In particular, a block generally extends much further in the X-direction than in the Y-direction so that extending a block by a small amount in the X-direction will not greatly affect the area occupied by the block.

Figure 17:
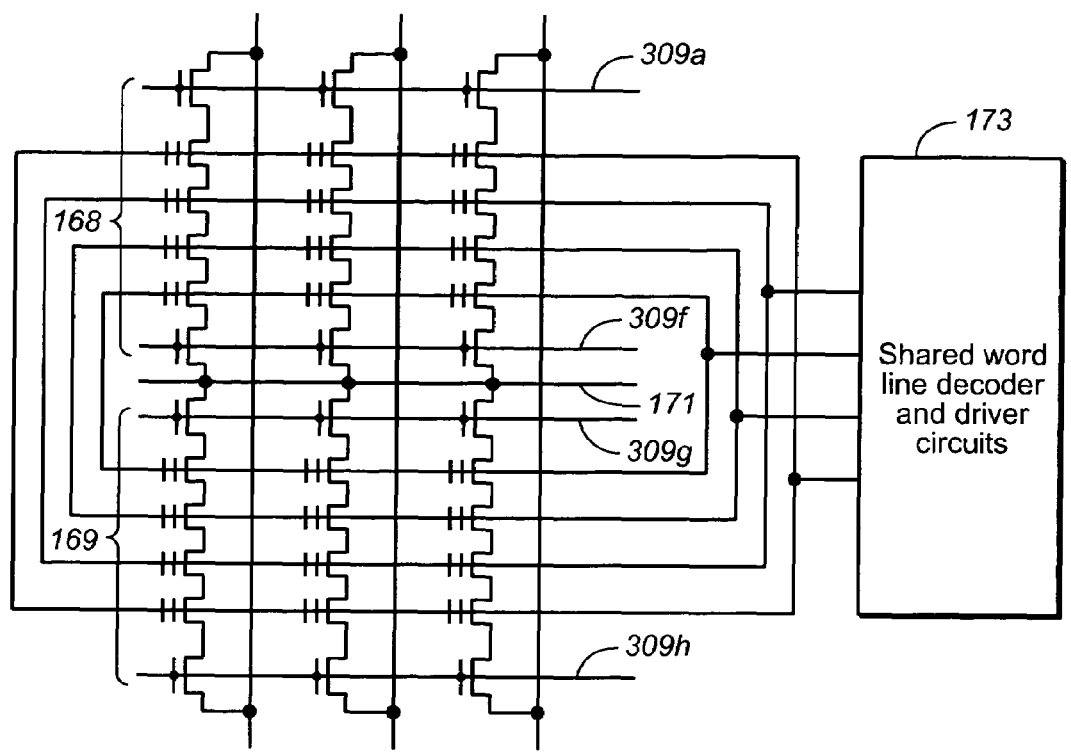
FIG. 17 shows an equivalent circuit diagram for the structure of FIG. 16 with bit lines that are not shown in FIG. 17.

FIG. 17 shows a circuit diagram for the structure of FIG. 16. FIG. 17 shows three NAND strings connected above a common source line 171 to form the first unit 168, and three NAND strings connected below common source line 171 to form the second unit 169. In some cases, first unit 168 and second unit 169 are separately erasable, and so may be considered as separate blocks. Source select lines 309f, 309g and drain select lines 309a, 309h are connected to circuits that enable portions of the memory array to be separately accessed. However, these connections are not shown for clarity in FIG. 17. In addition, word lines are connected to shared word line decoder and driver circuits 173 used to access the memory array. Because word lines of first unit 168 and second unit 169 are connected together, shared word line decoder and driver circuits 173 serve both units. In this way, the amount of space on a memory die that is devoted to word line decoder and driver circuits may be reduced by half compared with a memory die that does not share circuits in this manner. While word lines are connected between adjacent units 168 and 169, and word line decoder and driver circuits 173 are also shared between adjacent units 168 and 169, select gate driver circuits are not shared so that select lines 309a, 309f of unit 168 and select lines 309g, 309h of unit 169 are separately controlled.

Contact Pads

In some cases, forming good connections to word lines may be difficult because of the small size of the word lines. For example, where it is desired to form a plug to connect to a word line in the vertical direction, the plug will generally have a diameter of F and so extends beyond a word line having a width of F/2 and may electrically contact a neighboring word line if there is any misalignment.

Figure 18:
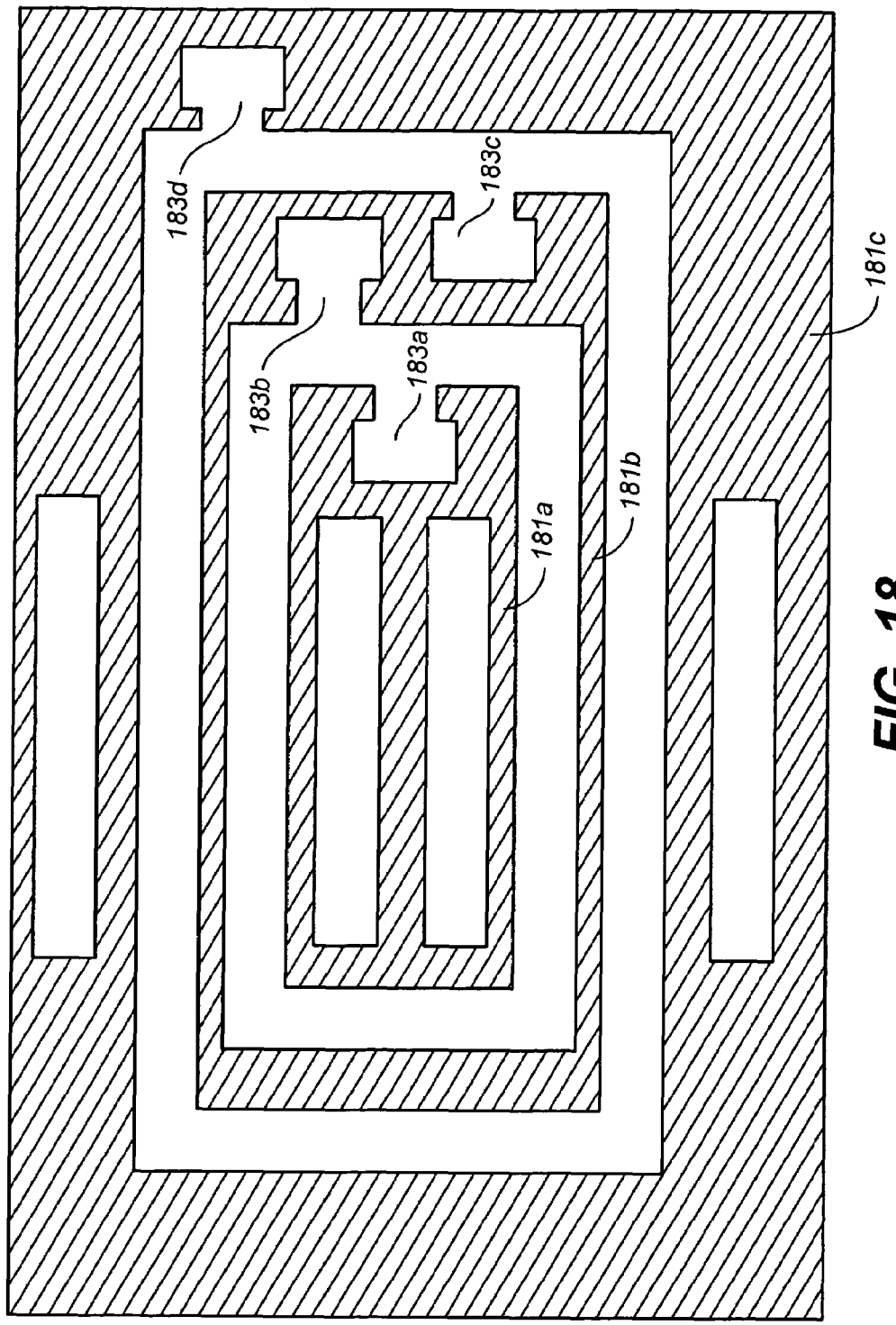
FIG. 18 shows an alternative embodiment at an intermediate stage of fabrication including photoresist portions with openings to form contact pads.

In order to provide good contacts to narrow word lines an embodiment of the present invention provides contact pads that are formed integrally with the word lines, the pads having dimensions that are greater than the width of the word line (F/2) and may be greater than the minimum feature size. FIG. 18 shows a pattern of photoresist portions 181a-c according to this embodiment including additional openings 183a-d in photoresist portions 181a-c that are used to form contact pads. FIG. 18 is similar to FIG. 12 apart from the addition of openings 183a-d.

Figure 19:
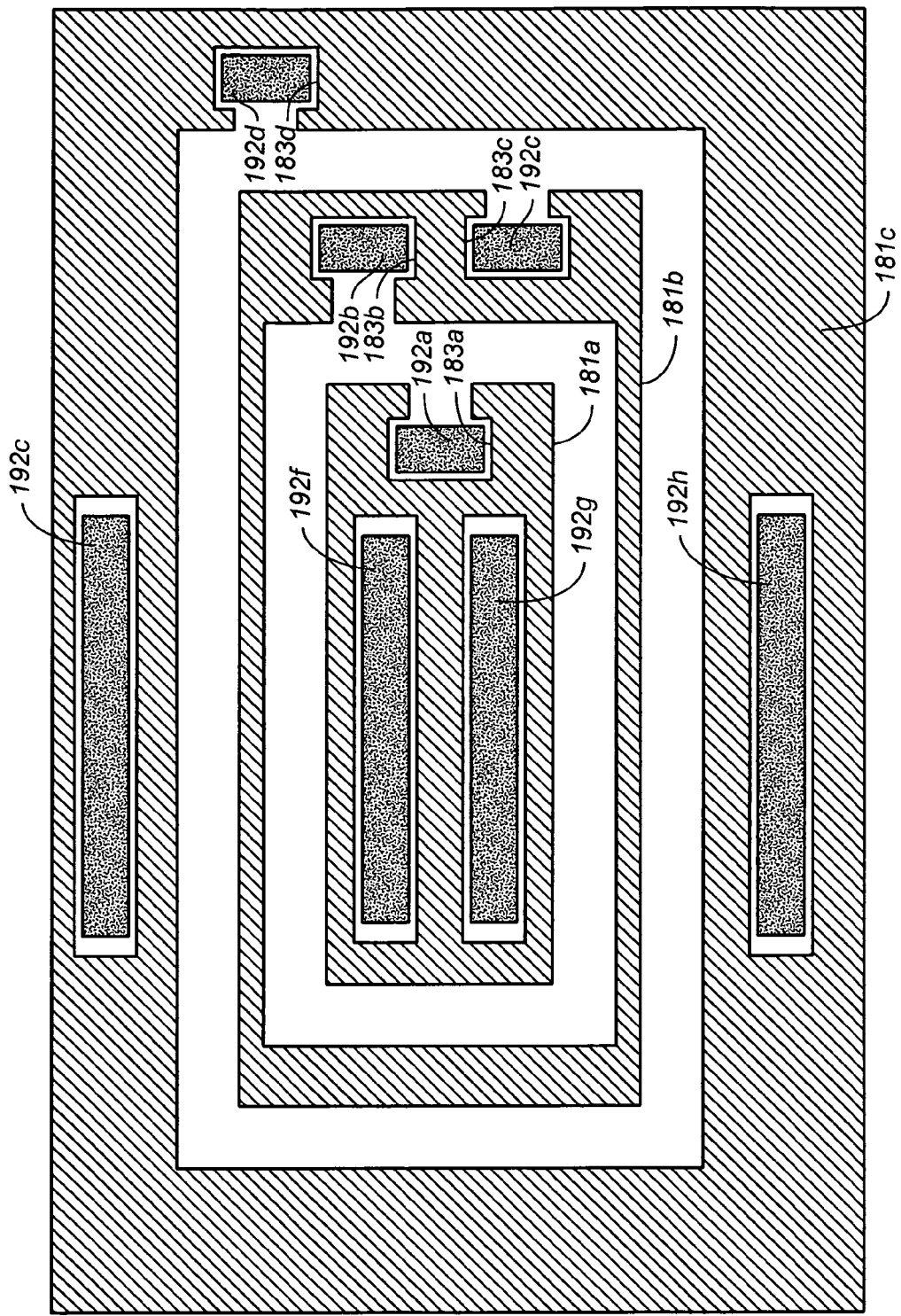
FIG. 19 shows the structure of FIG. 18 after photoresist slimming and etching of Silicon Nitride using slimmed photoresist portions as an etch mask, deposition of a Silicon dioxide layer and subsequent formation of photoresist portions to cover parts of the Silicon dioxide layer.

FIG. 19 shows the structure of FIG. 18 after resist slimming, transfer of the resist pattern to a masking layer and deposition of a third dielectric layer overlying the masking layer and a second polysilicon layer. Unlike the prior embodiment, FIG. 19 shows photoresist portions 192a-d overlying additional openings 183a-d. FIG. 19 also shows photoresist portions 192e-h deposited over openings in the inner photoresist portion 181a and outer photoresist portion 181c as before. Photoresist portions 192a-h may be formed together in a single patterning step. Openings and additional openings are protected by photoresist portions 192a-h during subsequent etching of the third dielectric layer. The result is that, when remaining portions of the third dielectric layer are used to pattern a second polysilicon layer to form word lines, contact pads are formed that are connected to the word lines. Contact pads have dimensions that are greater than F/2 and may have dimensions greater than F.

Figure 20:
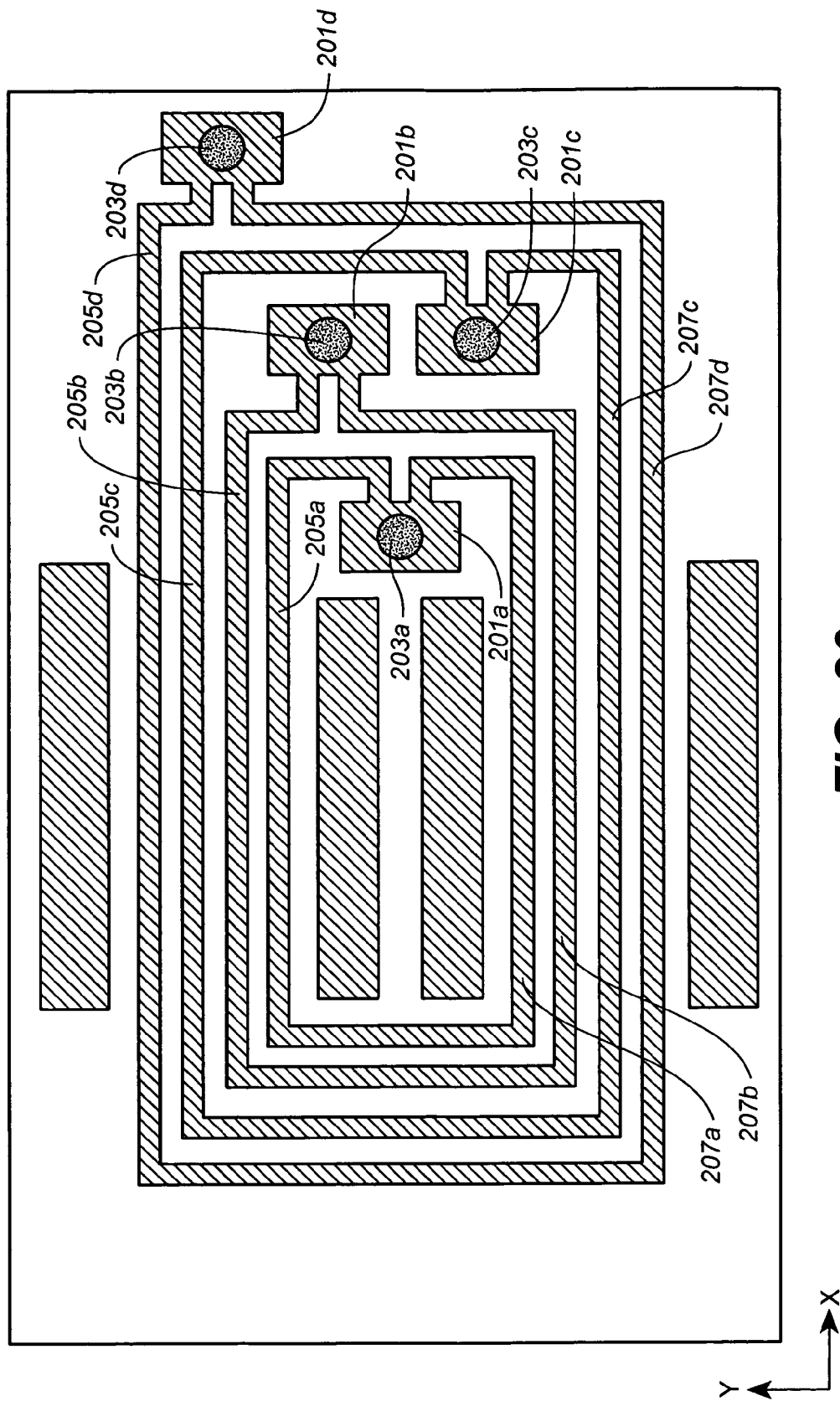
FIG. 20 shows the structure of FIG. 19 after etching of the Silicon dioxide layer, removal of photoresist portions, removal of Silicon Nitride portions, etching of underlying polysilicon layers to form word lines and floating gates and formation of word line contacts to contact pads.

FIG. 20 shows the structure of FIG. 19 after etching of a third dielectric layer, removal of photoresist portions 192a-h and etching of first and second polysilicon layers. Contact pads 201a-d are shown with plugs 203a-d formed in the vertical direction to connect word lines 205a-d, 207a-d to word line decoder and driver circuits. Plugs 203a-d may connect to conductive lines that are later formed at a higher level over the memory array. While the space occupied by the contact pads 201a-d appears significant in FIG. 20, this drawing is not to scale. In real NAND memory arrays, a block extends much farther in the X-direction than the Y direction so that an increase of a few times F in the X-direction may not greatly increase the overall size of a block.

Shield Plate

Figure 21:
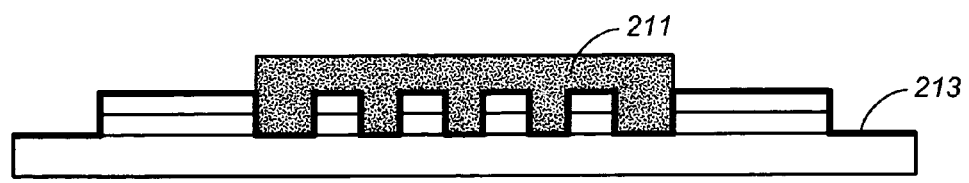
FIG. 21 shows a cross section of a shield plate formed over a portion of a NAND array according to an embodiment of the present invention.
Figure 22:
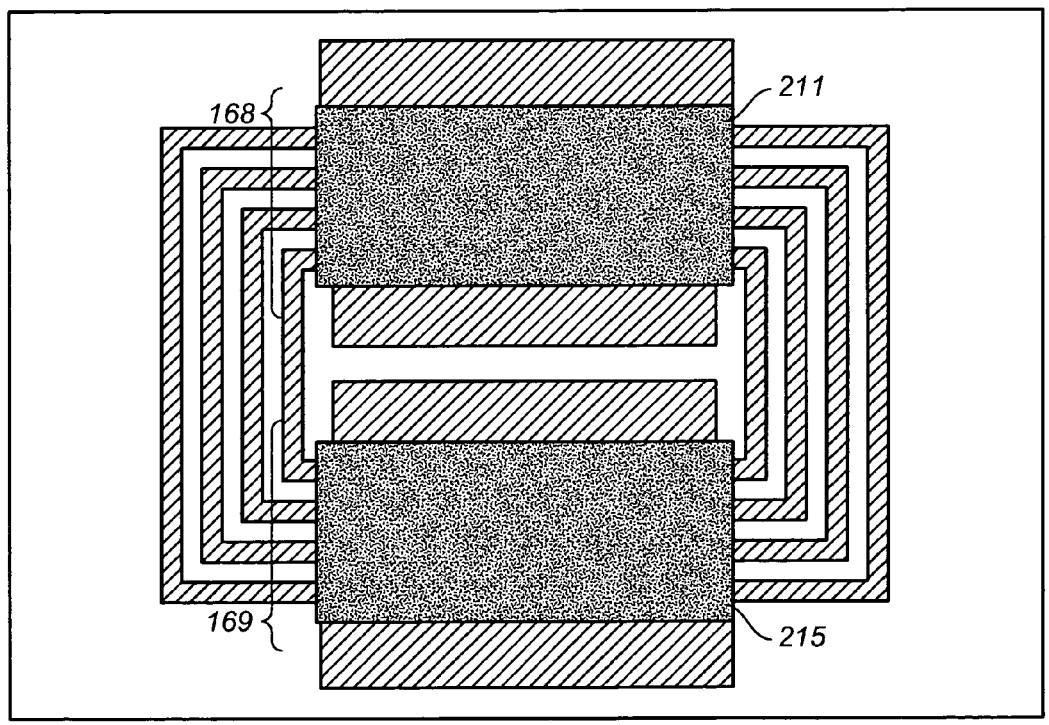
FIG. 22 shows the portion of a NAND array with shield plate of FIG. 21 in plan view and a second shield plate extending over a second portion of the NAND array.

In some embodiments, shield plates are formed subsequent to formation of separate word lines and floating gates. Sidewall spacers and wide dielectric portions are generally removed prior to formation of shield plates. FIG. 21 shows the structure of FIG. 11 along the same cross section after removal of sidewall spacers 717b-e and wide dielectric portions 717a, 717f and formation of a shield plate 211. A dielectric layer 213 is first formed that overlies source/drain regions, floating gates and word lines. Dielectric layer 213 provides electrical insulation on the surfaces of floating gates and word lines. Subsequently, conductive shield plate 211 is formed. In this example, conductive shield plate 211 is formed of doped polysilicon, though other conductive materials may also be used. FIG. 22 shows the structure of FIG. 21 in plan view. Separate conductive shield plates 211, 215 are formed corresponding to unit 168 and unit 169 respectively. Shield plates 211, 215 are not in electrical contact with floating gates or word lines because dielectric layer 213 separates shield plates 211, 215 from floating gates and word lines. However, a shield plate is capacitively coupled to floating gates so that the voltage of a shield plate may be used to modify the voltage of a floating gate. Shield plates 211, 215 allow separate erasing of unit 168 and unit 169 and thus define blocks in the memory array. In an alternative embodiment, unit 168 and unit 169 may only be erasable together and so form a single block.

Figure 23:
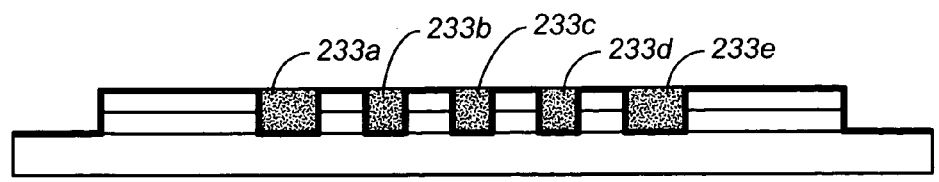
FIG. 23 shows a cross section of an alternative shield plate formed over a portion of a NAND array according to an embodiment of the present invention.
Figure 24:
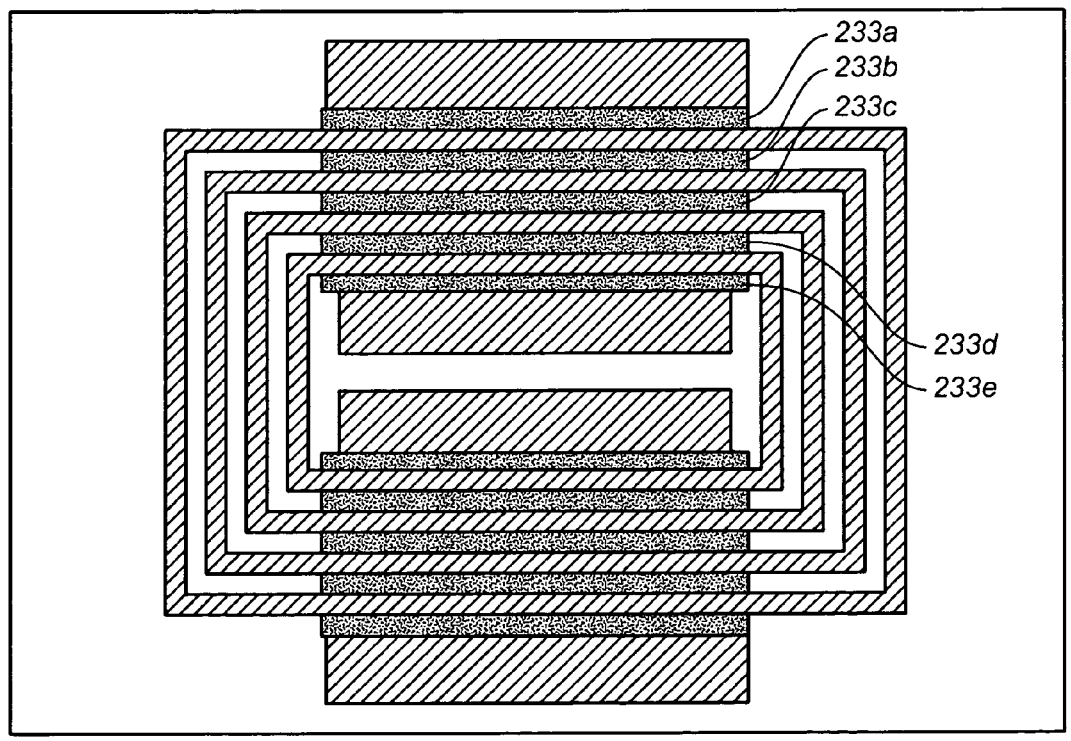
FIG. 24 shows the portion of the NAND array with shield plate of FIG. 23 in plan view and a second shield plate extending over a second portion of the NAND array.

A shield plate may extend over and between adjacent word lines and floating gates as shown in FIGS. 21-22 or may extend between adjacent word lines and floating gates but not extend over them as shown in FIG. 23. The structure of FIG. 23 may be achieved by applying Chemical Mechanical Polishing (CMP) or an etch-back process to the structure shown in FIG. 21. FIG. 24 shows the structure of FIG. 23 in plan view. Separate conductive portions 233a-e shown in FIG. 24 may be electrically connected together so that they form a single conductive unit. Formation and use of shield plates in NAND memory arrays are described in US Patent Application Publication No. 2005/0180186 entitled, "Shield plate for limiting cross coupling between floating gates." Shielding in NAND arrays is also described in US Patent Application Publication No. 2005/0072999, entitled "Bitline direction shielding to avoid cross coupling between adjacent cells for NAND flash memory." In the present application, shield plates are not connected to source/drain regions and are separately controlled so that a voltage may be applied to a shield plate. Thus, a shield plate generally has a connection to a shield plate driver circuit that controls the voltage of the shield plate.

Figure 25:
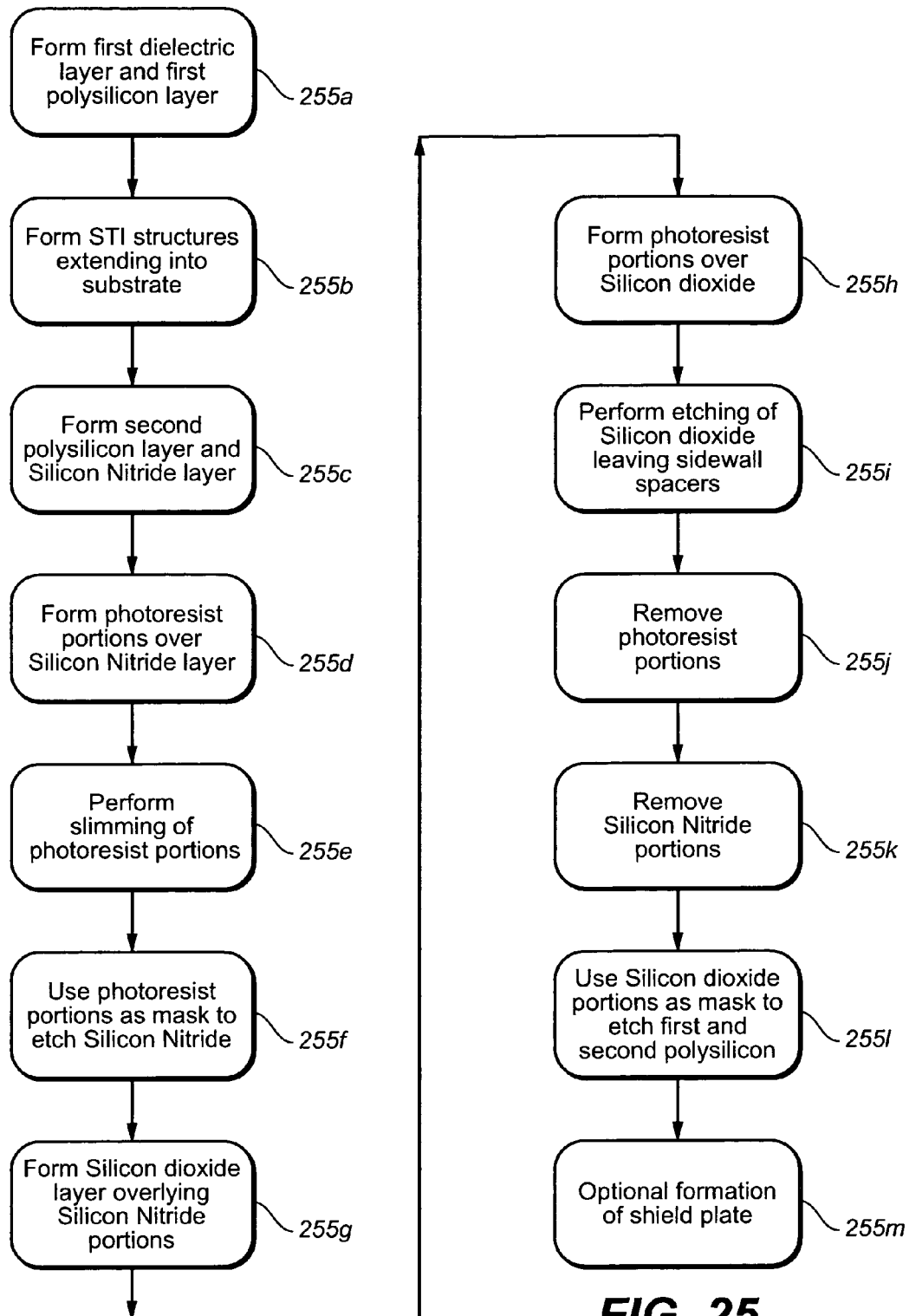
FIG. 25 shows a flowchart of a process for fabrication of a NAND flash memory array according to an embodiment of the present invention.

FIG. 25 shows a flowchart for fabricating a memory array according to an embodiment of the present invention. A first dielectric layer and first polysilicon layer are formed on a substrate surface 255a. The polysilicon is generally deposited so that it is doped and therefore electrically conductive. In some cases, the first polysilicon layer may be deposited undoped and later doped. STI structures are formed 255b by patterning the substrate, forming trenches that extend into the substrate. The trenches are filled with STI material such as Silicon dioxide. Subsequently, a second doped polysilicon layer is deposited 255c that overlies both STI structures and first polysilicon portions. The first and second polysilicon portions are separated by a second dielectric layer. A Silicon Nitride masking layer is formed over the second polysilicon layer. Next, a photoresist layer is formed over the Silicon Nitride layer 255d and is patterned into photoresist portions that include one or more concentric, rectangular shaped strips. A slimming process is performed 255e on the photoresist portions so that the thickness of the strips is reduced to about half the minimum feature size of the lithographic process used. Then the slimmed photoresist portions are used to pattern the Silicon Nitride layer into portions that also have a width that is approximately half the minimum feature size 255f. A Silicon dioxide layer is then formed 255g over both the Silicon Nitride portions and the exposed portions of the second polysilicon layer. Photoresist portions are formed 255h to cover parts of the Silicon dioxide layer that are to be protected. Then an anisotropic etch is performed 255i that removes Silicon dioxide except in locations close to sidewalls of Silicon Nitride portions and locations covered by photoresist portions. Photoresist portions cover areas that later become source select lines and drain select lines. In some examples, contact pad areas are also covered by photoresist portions. Photoresist portions are then removed 255j and Silicon Nitride portions are also removed 255k leaving Silicon dioxide portions on the second polysilicon layer. These Silicon dioxide portions are then used as a mask to etch the first and second polysilicon layers to form word lines and floating gates 255l. In some cases, shield plates are then formed 255m by depositing a dielectric layer followed by a third polysilicon layer to form a conductive polysilicon plate.

Memory Operation

Figure 26:
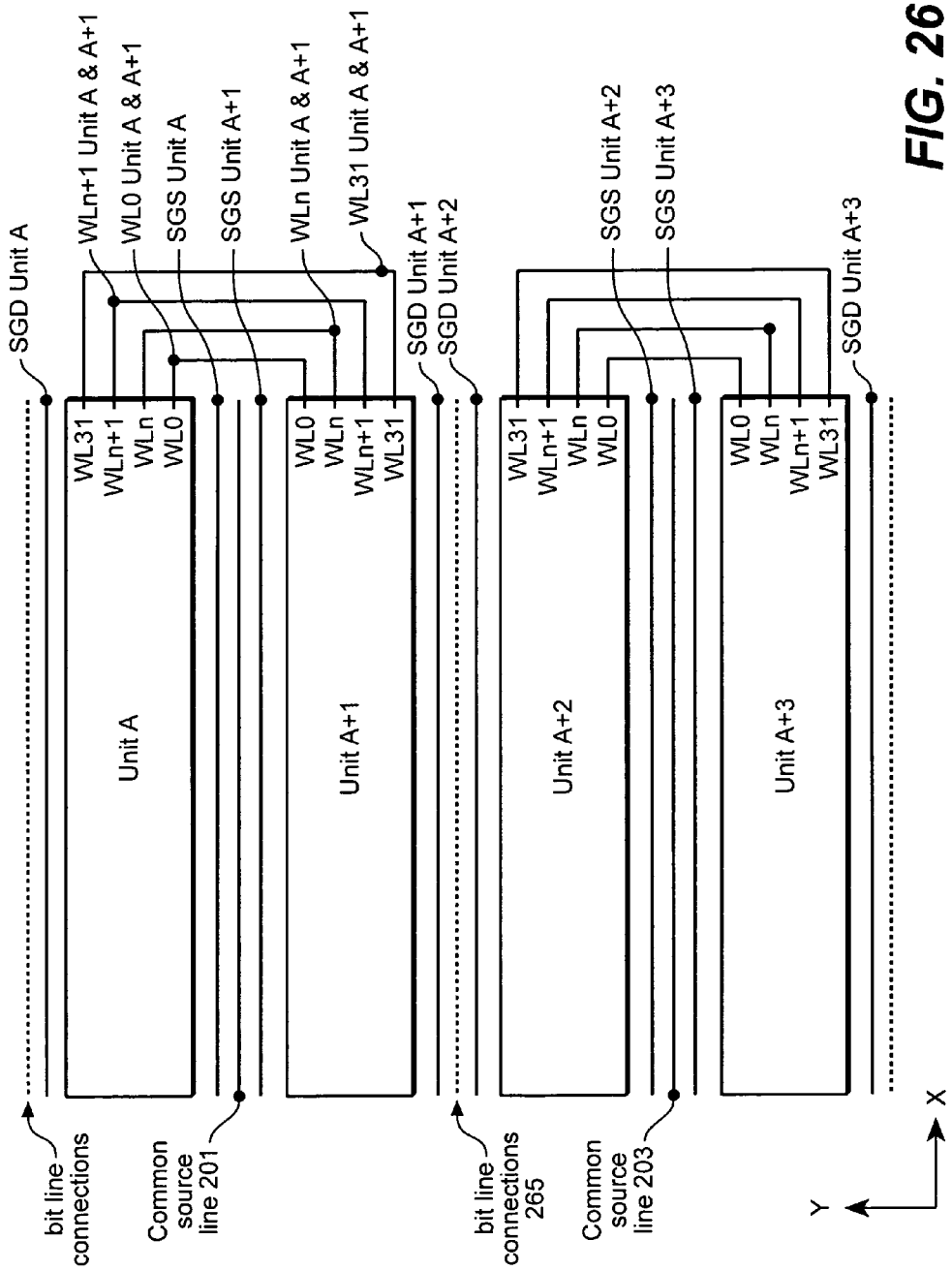
FIG. 26 shows electrical connections to elements of a NAND array according to an embodiment of the present invention.

The operation of a memory array according to an embodiment of the present invention that does not use a shield plate will now be described. FIG. 26 shows a portion of a NAND memory array made up of four units, unit A, A+1, A+2, and A+3. Each of the units A through A+3 contain many NAND strings with 32 memory cells in each NAND string. Unit A and unit A+1 are similar in structure to units 168, 169 of FIG. 16 except that they have 32 word lines instead of 4, and have many NAND strings. The NAND strings of a unit extend between source select gates and drain select gates. Thus, unit A comprises many NAND strings extending between a drain select gate line (SGD Unit A) and a source select gate line (SGS Unit A). In many prior NAND arrays, a block consisted of a similar grouping of NAND strings to that of Unit A. However, the term "block" is generally used to describe the minimum unit of erase of a memory array and because unit A is not separately erasable, the term "unit" is used instead of the term "block." However, it will be understood that unit A resembles a block of a prior art NAND array and has a similar structure. Unit A has 32 word lines, WL0-WL31 extending in the X-direction. Only a few word lines (WL0, WLn, WLn+1 and WL31) are shown for clarity, with WLn being a representative word line. As is shown in FIG. 26, word lines WL0-WL31 of unit A are connected to WL0-WL31 of unit A+1. Such connections may be formed as described earlier in the present application, or in some other manner. Word lines WL0-WL31 may be connected at both ends, forming concentric, closed, rectangular shaped loops. For clarity, connecting portions between units are only shown at one end. Adjacent units, such as units A and A+1, are separately selectable by using select gates, however, because word lines of adjacent units are joined together, such adjacent units are not separately erasable in the present example. Thus, unit A and unit A+1 are erased together and so form a block. Similarly, unit A+2 and unit A+3 are erased together and so form a block. A common source line 261 extends between adjacent units A and A+1, and another common source line 263 extends between units A+2 and A+3. Bit line connections 265 are formed between unit A+1 and A+2 and also between unit A and an adjacent unit (not shown).

FIG. 27A shows the voltages that are applied to various elements of the memory array of FIG. 26 in order to perform a read operation. A read operation determines the logical states of memory cells based on the amount of charge stored in floating gates. In this case, the read operation is performed on cells of word line WLn of unit A+1. Thus, only floating gate memory cells in unit A+1 that underlie word line WLn are read in this operation. Other floating gate memory cells are not read at this time. The drain and source select gates (SGD and SGS) are set to VSS (0 volts) for all units except unit A+1 so that select transistors are turned off for all units except unit A+1. Drain and source select gates for unit A+1 are set to VSG (4.5 volts) to turn on select transistors for unit A+1. In this way, bit lines that serve units A through A+3 (and other units) are electrically connected only to NAND strings of unit A+1. Word lines WLn of units A and A+1 have VSS (approximately 0 volts) applied, while all other word lines (WL0 to WLn−1 and WLn+1 to WL31) of units A and A+1 have VREAD (approximately 4.5 volts) applied. The result is that floating gate transistors of all word lines except WLn are turned on so that NAND strings are conductive apart from floating gate transistors underlying WLn. The state of floating gate transistors under WLn may thus be read by passing a current through NAND strings and measuring the effect of charge in the floating gates under WLn. Voltages on word lines of units other than units A and A+1 may be allowed to float during reading of unit A+1. Data is read out through bit lines with the common source lines ("Array source") held at VSS (0 volts) and the P-well in the substrate also at VSS.

FIG. 27B shows the voltages that are applied to various elements of the memory array of FIG. 26 in order to perform a program operation. The program operation adds charge to floating gates of memory cells to change the logical state of the memory cell. In this case, the programming operation is performed on memory cells of WLn of unit A+1. This means that the floating gate memory cells underlying WLn, in unit A+1 are programmed, while other cells are not programmed. The drain and source select gates (SGD and SGS) are set to VSS (0 volts) for all units except unit A+1 so that select transistors are turned off for all units except unit A+1. The source select gate for unit A+1 is also set to 0 volts. The drain select gate for unit A+1 is set to Vdd (approximately 2.5 volts). All word lines except for WLn are set to a voltage of VPASS (approximately 10 volts). WLn receives a voltage of VPGM (approximately 20 volts). This relatively high voltage may cause electrons to enter the floating gate from the substrate depending on a programming voltage supplied by a bit line. In a common arrangement, programming voltages are applied by bit lines as a series of pulses. In one example, 0 volts applied to a bit line causes programming of a cell. Cells that have reached their desired voltages receive a bit line voltage of Vdd to inhibit further programming. Programming may involve multiple pulsing and verifying steps. Word lines of units other than units A and A+1 are allowed to float during programming of unit A+1. In some examples, bit lines may be used to enable or inhibit programming of individual cells along WLn as cells reach their desired state. Cells of a word line may be programmed together, or in groups.

FIG. 27C shows the voltages that are applied to various elements of the memory array of FIG. 26 during an erase operation. The erase operation removes charge from floating gates to return them to a base level of charge that allows them to be programmed again. Charge is removed by creating an electrical field between word lines and the substrate that causes charge to flow from the floating gate to the substrate. An appropriate electrical field is created by appropriately biasing word lines and the underlying P-well in the substrate. Because word lines of units A and A+1 are connected together in FIG. 26, the memory cells of units A and A+1 are erased together. Drain and source select gates are allowed to float during erase. All word lines WL0-WL31 are set to VSS (approximately 0 volts), while the voltage of the P well in the substrate is set to VERA (approximately 20 volts). Thus, a 20 volt difference exists between a word line above a floating gate and the substrate below the floating gate. Floating gates in both units A and A+1 are subject to this electrical field and so they are both erased as a single block. Word lines of other units such as units A+2 and A+3 are allowed to float so no erase occurs in units A+2 and A+3.

Figure 28:
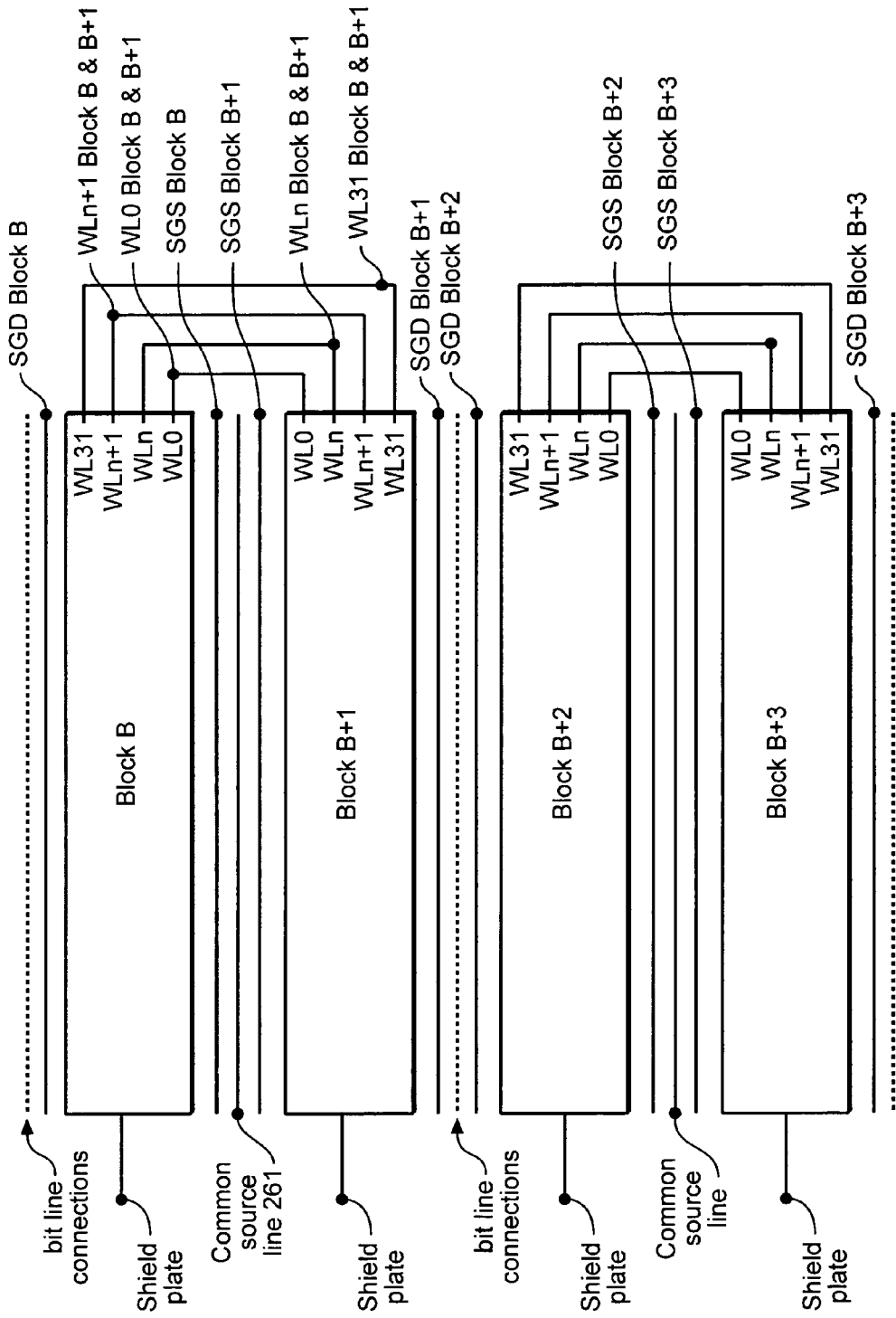
FIG. 28 shows electrical connections to elements of a NAND array that has a shield plate according to an embodiment of the present invention.

FIG. 28 shows an alternative embodiment where shield plates are used to establish two separately erasable blocks that share the same word lines. FIG. 28 shows blocks B, B+1, B+2 and B+3 connected in a manner similar to units A, A+1, A+2 and A+3 of FIG. 26, but with shield plates provided. The addition of shield plates allows separate erasing of blocks because an electric field sufficient to cause charge to be removed from a floating gate may be created by applying suitable voltages to the separate shield plates of different blocks.

FIG. 29A shows the voltages that are applied to various elements of the memory array of FIG. 28 during a read operation. These voltages are the same as those given in FIG. 27A except for the addition of shield plate voltages for each block. The shield plate voltage for block n that is not being read is VRSP (approximately 4.0 volts). The shield plate voltage for block n+1, which is being read, is also VRSP. While a value of VRSP in this example is approximately 4.0 volts, in other examples, VRSP may be set at a different voltage, or may be allowed to float. The shield plate voltages for all other blocks, such as blocks n+2 and n+3 may be allowed to float.

FIG. 29B shows the voltages that are applied to various elements of the memory array of FIG. 28 during a program operation. These voltages are the same as those given in FIG. 27B except for the addition of shield plate voltages for each block. The shield plate voltage for block B, which is not being programmed, is set at VPSP (approximately 10 volts). The voltage shield plate voltage for block B+1, which is being programmed, is also set at VPSP (approximately 10.0 volts). Other values of VPSP may also be used. Shield plates of other blocks, such as blocks B+2 and B+3 may be allowed to float during programming of block B+1.

FIG. 29C shows the voltages that are applied to various elements of the memory of FIG. 28 during an erase operation. These voltages are the same as those given in FIG. 27C except for the addition of shield plate voltages. Significantly, the addition of shield plates and the application of shield plate voltages allows individual blocks to be erased in the present embodiment, where in the embodiment of FIG. 27C both units A and A+1 were used together as a single block. A voltage of VEISP (approximately 18 volts) is applied to the shield plate of block B, which is not being erased. The application of this high voltage inhibits erase of block B by coupling a high voltage to floating gates and thereby reducing the voltage difference between floating gates and the substrate that would cause charge flow. A voltage of VESSP (approximately 5 volts) is applied to the shield plate of block B+1, which is being erased. This relatively low voltage couples to the floating gates, keeping floating gate voltage relatively low, so a large voltage difference exists between floating gates and the P-well in the substrate (at 20 volts). This large voltage difference causes charge to flow from the floating gate to the substrate. Thus, the addition of a shield plate allows separate erase of different blocks that share the same word lines.

Although the various aspects of the present invention have been described with respect to exemplary embodiments thereof, it will be understood that the present invention is entitled to protection within the full scope of the appended claims.

The invention claimed is:

1. A method of forming a nonvolatile memory array on a substrate surface comprising:
   forming a plurality of shallow trench isolation structures on a substrate, individual ones of the plurality of shallow trench isolation structures extending in a first direction, ones of the plurality of shallow trench isolation structures spaced apart in a second direction; and
   subsequently forming a plurality individual continuous conductive regions, an individual continuous conductive region including first, second, third and fourth conductive portions, the first conductive portion extending in the second direction and overlying the plurality of shallow trench isolation structures, the second conductive portion extending in the second direction and overlying the plurality of shallow trench isolation structures, the first and second conductive portions spaced apart in the first direction, the third and fourth conductive portions extending in the first direction to physically connect the first and second conductive portions, the first conductive portion of each individual continuous conductive region forms a first control line, the second conductive portion of each individual continuous conductive region forms a second control line.

2. The method of claim 1 wherein the individual conductive region forms a closed rectangle, and the first, second, third and fourth conductive portions form the sides of the rectangle.

3. The method of claim 1 wherein the first control line is a first word line and the second control line is a second word line.

4. The method of claim 1 wherein a width of an individual one of the plurality of continuous conductive regions is established by spacers formed on sidewalls.

5. The method of claim 4 wherein the width is less than a minimum feature size of a lithographic process used to form the nonvolatile memory array.

6. The method of claim 5 wherein the spacers are slimmed to be less than the minimum feature size of the lithographic process used.

7. The method of claim 5 further comprising forming select gate lines that extend in the first direction, the select gate lines being at least as wide as the minimum feature size.

8. The method of claim 1 further comprising forming floating gates underlying the plurality of first conductive portions so that a first plurality of NAND strings is formed between the plurality of shallow trench isolation structures.

9. The method of claim 8 wherein the first plurality of NAND strings extend between a first select gate line and a second select gate line.

10. The method of claim 9 further comprising forming a first conductive shield plate that extends over the first plurality of NAND strings.

11. The method of claim 10 further comprising forming floating gates underlying the plurality of second conductive portions so that a second plurality of NAND strings is formed between the plurality of shallow trench isolation structures, the second plurality of NAND strings extending between a third select gate line and a fourth select gate line and a second conductive shield plate extending over the second plurality of NAND strings.

12. The method of claim 1 further comprising forming a conductive shield plate that extends between the plurality of continuous conductive regions.

13. A method of forming a nonvolatile memory array on a substrate surface comprising:
 forming a plurality of shallow trench isolation structures on a substrate, individual ones of the plurality of shallow trench isolation structures extending in a first direction, ones of the plurality of shallow trench isolation structures spaced apart in a second direction; and
 subsequently forming a plurality of individual continuous conductive loops, an individual continuous conductive loop including first, second, third and fourth conductive portions, the first conductive portion extending in the second direction and overlying the plurality of shallow trench isolation structures, the second conductive portion extending in the second direction and overlying the plurality of shallow trench isolation structures, the first and second conductive portions spaced apart in the first direction, the third and fourth conductive portions extending in the first direction to connect the first and second conductive portions;
 forming a first plurality of NAND strings between the plurality of shallow trench isolation structures, the first plurality of NAND strings underlying the first conductive portions of the individual continuous conductive loops, each first conductive portion of each of the individual continuous conductive loops is a word line for the first plurality of NAND strings; and
 forming a second plurality of NAND strings between the plurality of shallow trench isolation structures, the second plurality of NAND strings underlying the second conductive portions of the individual continuous conductive loops, each second conductive portion of each of the individual continuous conductive loops is a word line for the second plurality of NAND strings.

14. The method of claim 13 wherein a width of an individual one of the plurality of continuous conductive loops is established by spacers formed on sidewalls.

15. The method of claim 14 wherein the width is less than a minimum feature size of a lithographic process used to form the nonvolatile memory array.

16. The method of claim 15 further comprising forming select gate lines that extend in the first direction, the select gate lines being at least as wide as the minimum feature size.

17. The method of claim 16 wherein:
 the first plurality of NAND strings extend between a first of the select gate lines and a second of the select gate lines; and
 the second plurality of NAND strings extend between a third of the select gate lines and a fourth of the select gate lines.

18. The method of claim 17, further comprising:
 forming a first conductive shield plate that extends over the first plurality of NAND strings; and
 forming a second conductive shield plate that extends over the second plurality of NAND strings.

19. A method of forming a nonvolatile floating gate memory array, said method comprising:
 forming a first region of polysilicon over a substrate;
 forming a plurality of shallow trench isolation structures in the substrate, the shallow trench isolation structures separating the first region of polysilicon into a first plurality of polysilicon strips to be used to form a first plurality of floating gates and a second plurality of polysilicon strips to be used to form a second plurality of floating gates, ones of the plurality of shallow trench isolation structures extending in a first direction, ones of the plurality of shallow trench isolation structures spaced apart in a second direction;
 forming a second region of polysilicon over the first plurality of polysilicon strips, the second plurality of polysilicon strips, and the shallow trench isolation structures;
 etching the second region of polysilicon to form a plurality of continuous conductive closed loops, each of the plurality of continuous conductive loops has a first portion that extends in the second direction, a second portion that extends in the second direction, a third portion that extends in the first direction, and a fourth portion that extends in the first direction, the third portion physically connects the first and second portions, the fourth portion physically connects the first and second portions; and
 etching the first plurality of polysilicon strips and the second plurality of polysilicon strips to form the first plurality of floating gates and the second plurality of floating gates, the first portion of each of the plurality of continuous conductive loops serves as a word line for the first plurality of floating gates, the second portion of each of the plurality of continuous conductive loops serves as a word line for the second plurality of floating gates.

20. The method of claim 19 wherein the first plurality of floating gates are part of a first plurality of NAND strings, the second plurality of floating gates are part of a second plurality of NAND strings.

21. The method of claim 1 wherein the plurality of individual continuous conductive regions are formed in the same plane.

22. The method of claim 1 wherein the plurality of individual continuous conductive regions are concentric.

* * * * *

UNITED STATES PATENT AND TRADEMARK OFFICE
CERTIFICATE OF CORRECTION

PATENT NO. : 7,655,536 B2
APPLICATION NO. : 11/316474
DATED : February 2, 2010
INVENTOR(S) : Masaaki Higashitani It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 683 days.

Signed and Sealed this

Twenty-third Day of November, 2010

David J. Kappos
*Director of the United States Patent and Trademark Office*